(12) United States Patent
Yaegashi

(10) Patent No.: US 8,648,405 B2
(45) Date of Patent: *Feb. 11, 2014

(54) NONVOLATILE SEMICONDUCTOR MEMORY DEVICE INCLUDING MEMORY CELLS FORMED TO HAVE DOUBLE-LAYERED GATE ELECTRODES

(71) Applicant: Toshitake Yaegashi, Yokohama (JP)

(72) Inventor: Toshitake Yaegashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/644,641

(22) Filed: Oct. 4, 2012

(65) Prior Publication Data

US 2013/0026555 A1    Jan. 31, 2013

Related U.S. Application Data

(60) Continuation of application No. 12/721,316, filed on Mar. 10, 2010, now Pat. No. 8,304,826, which is a division of application No. 11/765,043, filed on Jun. 19, 2007, now Pat. No. 7,692,235.

(30) Foreign Application Priority Data

Jun. 20, 2006    (JP) .................................. 2006-170225

(51) Int. Cl.
*H01L 27/00*      (2006.01)

(52) U.S. Cl.
USPC ............... 257/319; 257/E27.103; 365/185.11

(58) Field of Classification Search
USPC ........ 362/185.11, 185.17; 257/315, 316, 317, 257/319, 321, E27.103; 365/185.11, 185.17
See application file for complete search history.

(56) References Cited

U.S. PATENT DOCUMENTS

| | | |
|---|---|---|
| 6,624,464 B2 | 9/2003 | Shin et al. |
| 6,756,631 B2 | 6/2004 | Wu |
| 6,759,708 B2 | 7/2004 | Hurley et al. |
| 6,927,132 B2 | 8/2005 | Iguchi et al. |

(Continued)

FOREIGN PATENT DOCUMENTS

| | | |
|---|---|---|
| JP | 11-163304 | 6/1999 |
| JP | 2003-289114 | 10/2003 |

(Continued)

OTHER PUBLICATIONS

Office Action issued Dec. 7, 2010 in Japanese Application No. 2006-170225 (with English translation).

*Primary Examiner* — Thomas L Dickey

(74) *Attorney, Agent, or Firm* — Oblon, Spivak, McClelland, Maier & Neustadt, L.L.P.

(57) ABSTRACT

A nonvolatile semiconductor memory device includes a plurality of floating gate electrodes respectively formed above a semiconductor substrate with first insulating films disposed therebetween, and a control gate electrode formed above the plurality of floating gate electrodes with a second insulating film disposed therebetween. In each of the plurality of floating gate electrodes is formed to have a width of an upper portion thereof in a channel width direction which is smaller than a width of a lower portion thereof in the channel width direction and one of contact surfaces thereof on at least opposed sides which contact the second insulating film is formed to have one surface, and the second insulating film has a maximum film thickness in a vertical direction, the maximum film thickness being set smaller than a distance from a lowest surface to a highest surface of the second insulating film in the vertical direction.

11 Claims, 17 Drawing Sheets

(56) References Cited

U.S. PATENT DOCUMENTS

| | | |
|---|---|---|
| 7,196,370 B2 | 3/2007 | Kai et al. |
| 7,595,522 B2 | 9/2009 | Takeuchi |
| 7,652,319 B2 | 1/2010 | Tsurumi et al. |
| 8,304,826 B2 * | 11/2012 | Yaegashi .................. 257/319 |
| 2003/0030098 A1 | 2/2003 | Hurley et al. |
| 2004/0077146 A1 | 4/2004 | Iguchi et al. |
| 2005/0047261 A1 | 3/2005 | Kai et al. |
| 2006/0237754 A1 | 10/2006 | Ishida |
| 2008/0012061 A1 | 1/2008 | Ichige et al. |

FOREIGN PATENT DOCUMENTS

| | | |
|---|---|---|
| JP | 2004-22819 | 1/2004 |
| JP | 2005-277035 | 10/2005 |
| JP | 2006-303308 | 11/2006 |
| JP | 2007-157893 | 6/2007 |

* cited by examiner

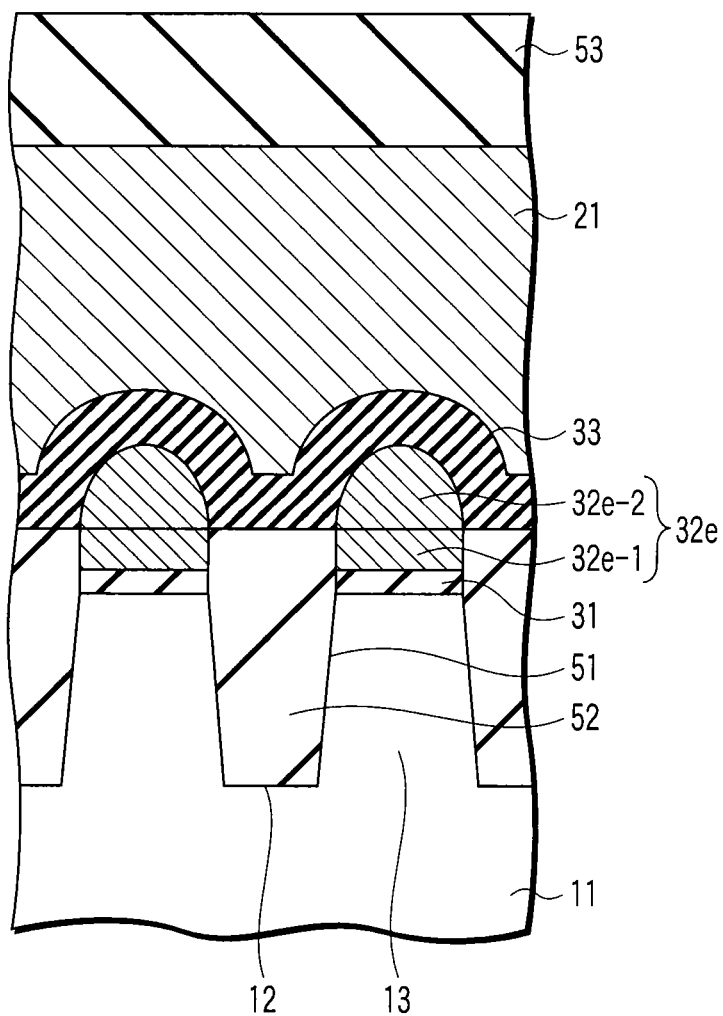
F I G. 22

NONVOLATILE SEMICONDUCTOR MEMORY DEVICE INCLUDING MEMORY CELLS FORMED TO HAVE DOUBLE-LAYERED GATE ELECTRODES

CROSS-REFERENCE TO RELATED APPLICATIONS

This application is a continuation of and claims the benefit of priority under 35 U.S.C. §120 from U.S. Ser. No. 12/721,316 filed Mar. 10, 2010, which is a division of U.S. Ser. No. 11/765,043 filed Jun. 19, 2007 (now U.S. Pat. No. 7,692,235 issued Apr. 6, 2010), and claims the benefit of priority under 35 U.S.C. §119 from Japanese Patent Application No. 2006-170225 filed Jun. 20, 2006, the entire contents of each of which are incorporated herein by reference.

BACKGROUND OF THE INVENTION

1. Field of the Invention

This invention relates to a nonvolatile semiconductor memory device and more particularly to a nonvolatile semiconductor memory device including memory cells formed to have double-layered gate electrodes each of which includes a floating gate electrode and control gate electrode.

2. Description of the Related Art

As an example of a nonvolatile semiconductor memory device including memory cells formed to have double-layered gate electrodes each of which includes a floating gate electrode and control gate electrode, a NAND nonvolatile semiconductor memory device is known. The memory cell array of the NAND nonvolatile semiconductor memory device is configured to have a plurality of NAND cell units CU. Each of the NAND cell units CU includes a memory cell string having a preset number of memory cells serially connected and two selection transistors connected to the drain side and source side of the memory cell string. Further, in the memory cell array, a bit line contact electrode electrically connected to the bit line and a source line contact electrode electrically connected to the source line are respectively arranged in positions adjacent to the respective selection transistors.

Each memory cell has a double-layered gate electrode which has a control gate electrode laminated above a floating gate electrode with a gate-gate insulating film disposed therebetween. Part of the control gate electrode is filled in between the floating gate electrodes which are opposed to each other in a direction (channel width direction: a direction perpendicular to the direction in which the channel current flows) along the word line configured by the control gate electrode with a gate-gate insulating film disposed therebetween and a certain coupling ratio of the memory cells can be attained.

However, for example, when the distance between the floating gate electrodes becomes smaller than twice the film thickness of the gate-gate insulating film with miniaturization of the memory cells, the space between the floating gate electrodes is filled with only the gate-gate insulating film. Then, there occurs a problem that the capacitance between the floating gate electrode and the control gate electrode becomes smaller, a sufficient coupling ratio of the memory cells cannot be attained and the characteristics of the memory cells will deteriorate.

Further, when the control gate electrode is formed of silicon, for example, the width of the control gate electrode filled in between the floating gate electrodes tends to become small even if the control gate electrode can be filled. In short, if the control gate electrode filled in between the floating gate electrodes is completely depleted at the operation time of the memory cell, there occurs a problem that the capacitance between the floating gate electrode and the control gate electrode becomes smaller, a sufficient coupling ratio of the memory cells cannot be attained and the characteristics of the memory cells will deteriorate.

A stacked-gate semiconductor memory in which a variation in the threshold voltage is suppressed by forming the cross-sectional area of the floating gate electrode in the width direction in a convex shape to reduce the capacitance between the floating gate electrodes is already proposed (for example, refer to Jpn. Pat. Appln. KOKAI Publication No. 2004-022819). However, according to the contents of this proposal, there occurs a problem that the step difference of the floating gate electrodes makes it difficult to etch the gate-gate insulating film filled in between the floating gate electrodes.

BRIEF SUMMARY OF THE INVENTION

According to a first aspect of the present invention, there is provided a nonvolatile semiconductor memory device comprising: a semiconductor substrate; a plurality of floating gate electrodes respectively formed above element regions of the semiconductor substrate with first insulating films disposed therebetween; and a control gate electrode formed above the plurality of floating gate electrodes with a second insulating film disposed therebetween, a portion of the control gate electrode being filled in between opposed ones of the plurality of floating gate electrodes, wherein each of the plurality of floating gate electrodes is formed to have a width of an upper portion thereof in a channel width direction which is smaller than a width of a lower portion thereof in the channel width direction and one of contact surfaces thereof on at least opposed sides which contact the second insulating film is formed to have one surface, and the second insulating film has a maximum film thickness in a vertical direction, the maximum film thickness being set smaller than a distance from a lowest surface to a highest surface of the second insulating film in the vertical direction.

According to a second aspect of the present invention, there is provided a nonvolatile semiconductor memory device comprising: a semiconductor substrate; a plurality of floating gate electrodes respectively formed above element regions of the semiconductor substrate with first insulating films disposed therebetween; and a control gate electrode formed above the plurality of floating gate electrodes with a second insulating film disposed therebetween, a portion of the control gate electrode being filled in between opposed ones of the plurality of floating gate electrodes, wherein each of the plurality of floating gate electrodes is formed to have a width of an upper portion thereof in a channel width direction which is smaller than width of a lower portion thereof in the channel width direction and one of contact surfaces thereof on at least opposed sides which contact the second insulating film is formed to have one flat surface, the plurality of floating gate electrodes each have a first contact surface which contacts the second insulating film and a second contact surface which does not contact the second insulating film, and a first angle between the first contact surface and the vertical direction is larger than a second angle between the second contact surface and the vertical direction.

According to a third aspect of the present invention, there is provided a nonvolatile semiconductor memory device comprising: a semiconductor substrate; a plurality of floating gate electrodes respectively formed above element regions of the semiconductor substrate with first insulating films disposed therebetween; and a control gate electrode formed above the plurality of floating gate electrodes with a second insulating film disposed therebetween, a portion of the control gate electrode being filled in between opposed ones of the plurality of floating gate electrodes; wherein each of the plurality of floating gate electrodes is formed to have a width of an upper portion thereof in a channel width direction, which is smaller than a width of a lower portion thereof in the channel width direction and one of contact surfaces thereof on at least opposed sides which contact the second insulating film is formed to have one curved surface.

According to a fourth aspect of the present invention, there is provided a nonvolatile semiconductor memory device comprising: a semiconductor substrate; a plurality of floating gate electrodes respectively formed above element regions of the semiconductor substrate with first insulating films disposed therebetween; and a control gate electrode formed above the plurality of floating gate electrodes with a second insulating film disposed therebetween, a portion of the control gate electrode being filled in between opposed ones of the plurality of floating gate electrodes, wherein the plurality of floating gate electrodes each have a curved top surface and a flat bottom surface.

BRIEF DESCRIPTION OF THE SEVERAL VIEWS OF THE DRAWING

FIG. 22 is a cross-sectional view showing a step for illustrating the manufacturing method of the nonvolatile semiconductor memory device of FIG. 18.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

[First Embodiment]

Figure 1:
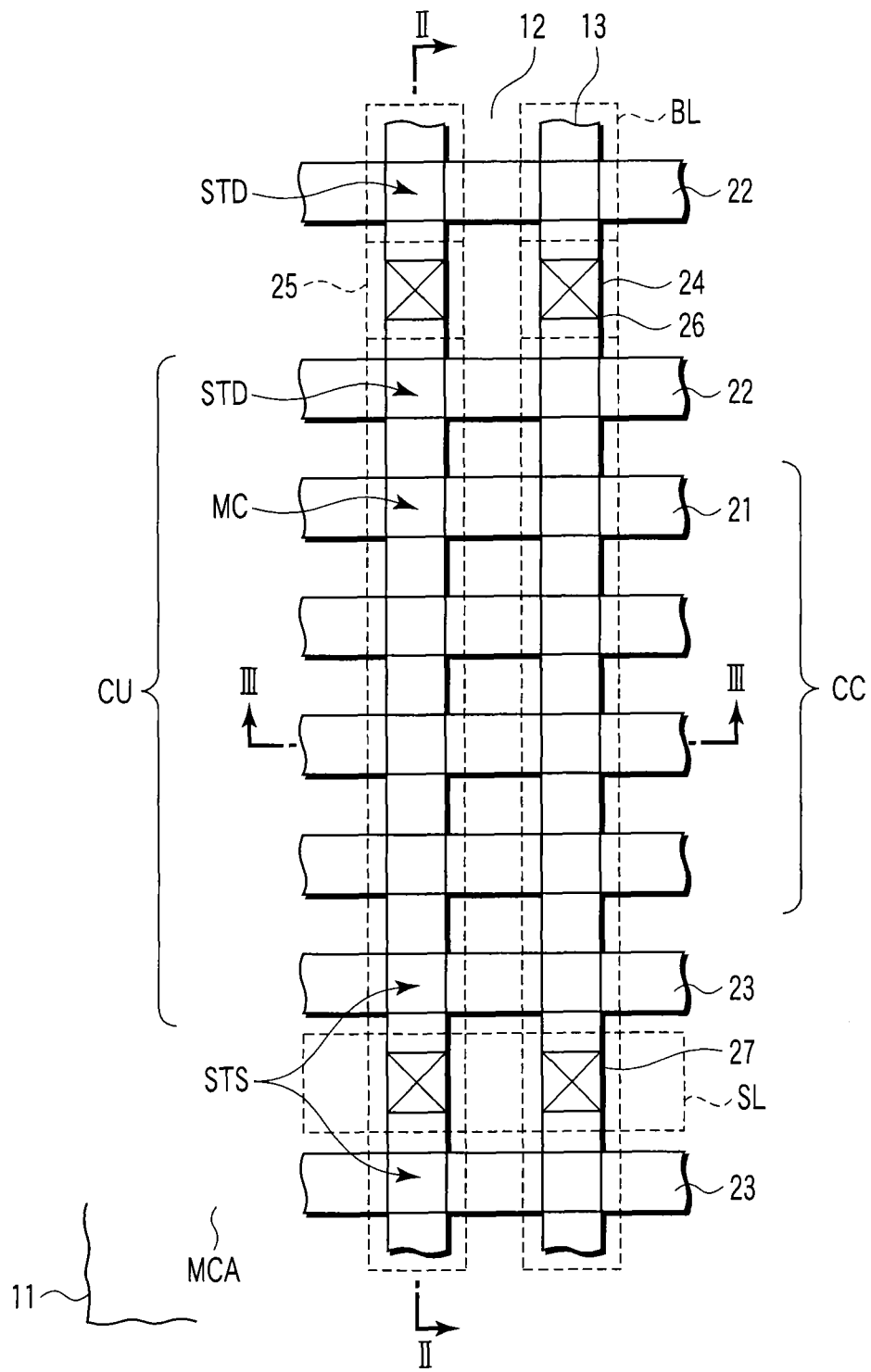
FIG. 1 is a plan view showing an example of the configuration of a nonvolatile semiconductor memory device (NAND type) according to a first embodiment of this invention.

FIG. 1 shows the basic configuration of a nonvolatile semiconductor memory device according to a first embodiment of this invention. In the present embodiment, a case wherein a NAND nonvolatile semiconductor memory device is used as an example of a nonvolatile semiconductor memory device including memory cells formed to have double-layered gate electrodes each of which includes a floating gate electrode and control gate electrode is explained. In this example, the number of memory cells in each memory cell string is set to four.

As shown in FIG. 1, the NAND nonvolatile semiconductor memory device is formed to have a plurality of NAND cell units CU. Each of the NAND cell units CU is configured to have a drain-side selection transistor STD and source-side selection transistor STS connected to a memory cell string CC having four series-connected memory cells MC. The NAND cell units CU are respectively provided on element regions 13 divided by element isolation regions 12 on a semiconductor substrate (for example, silicon substrate) 11.

A plurality of (two in the example shown in FIG. 1) memory cells MC arranged in a direction along the word lines which is a horizontal direction are connected to a corresponding one of common control gate lines (word lines WL) 21. The drain-side selection transistors STD are connected to a common drain-side selection transistor 22 and the source-side selection transistors STS are connected to a common source-side selection transistor 23. Each bit line connecting portion 25 formed of a first interconnect layer is connected to a corresponding one of the drain-side selection transistors STD via a bit line contact 24 and each bit line BL formed of a second interconnect layer is connected to the bit line connecting portion 25 via an interconnect-interconnect contact 26. A source line SL formed of the first interconnect layer is connected to the respective source-side selection transistors STS via source line contacts 27.

In the case of the present embodiment, each NAND cell unit CU is configured by the four memory cells MC, drain-side selection transistor STD and source-side selection transistor STS. Further, a plurality of NAND cell units CU with the above configuration are arranged side by side in the direction along the word line WL and arranged side by side in the direction along the bit line BL via the bit line contacts 24 and source line contacts 27 to realize one memory cell array MCA.

Figure 2:
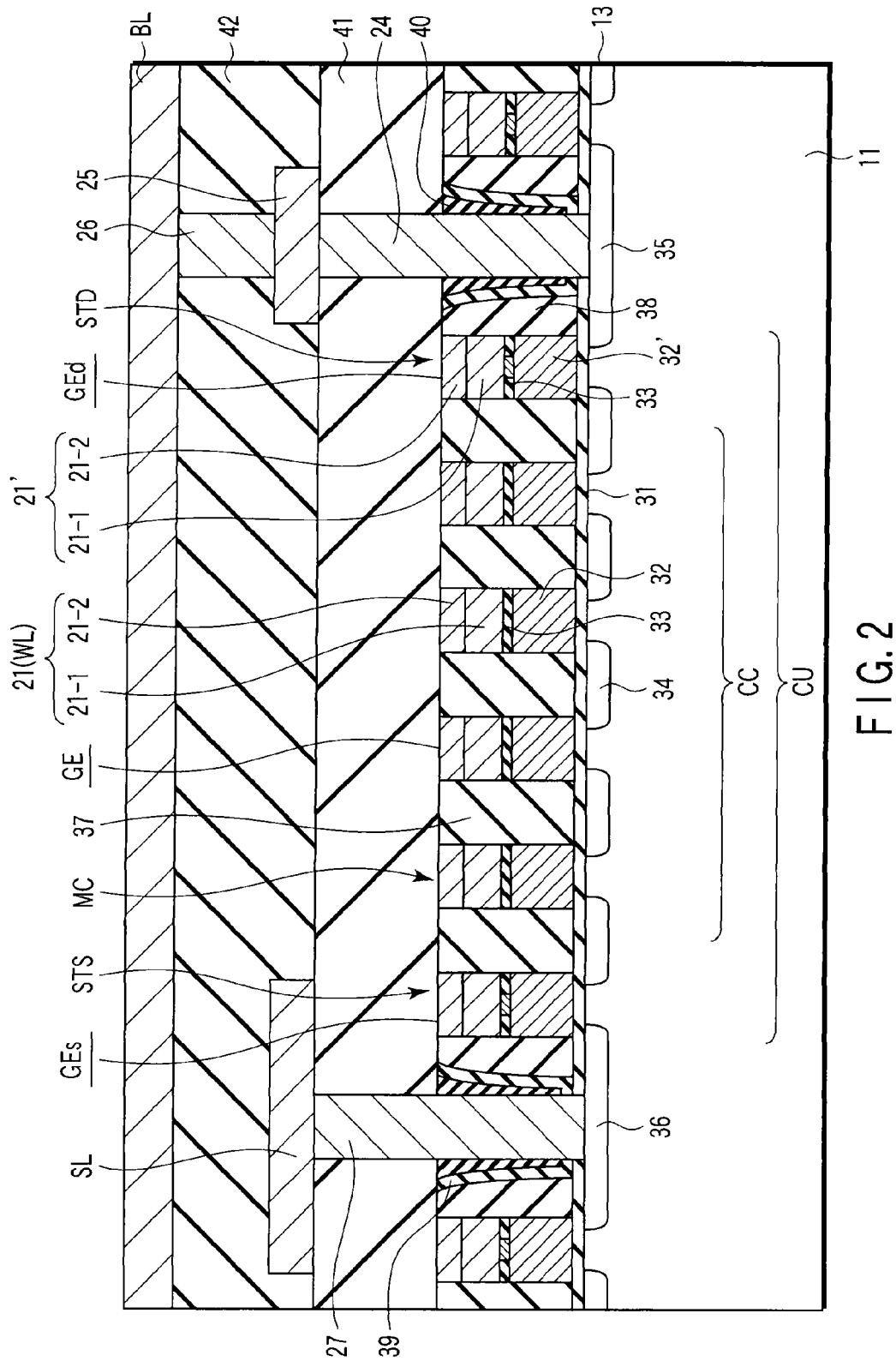
FIG. 2 is a cross-sectional view showing the nonvolatile semiconductor memory device taken along line II-II of FIG. 1.

FIG. 2 shows the cross section of the NAND nonvolatile semiconductor memory device taken along line II-II of FIG. 1. As shown in FIG. 2, the four memory cells MC of one NAND cell unit CU respectively have memory cell gate electrodes GE. The memory cell gate electrodes GE are provided above the element regions 13 formed on a well region (not shown) with a gate insulating film (first insulating film) 31 disposed therebetween. Each memory cell gate electrode GE includes a floating gate electrode 32 used as a charge storage layer, a gate-gate insulating film (second insulating film) 33 formed on the floating gate electrode 32 and a control gate electrode 21 formed on the gate-gate insulating film 33. The control gate electrode 21 is formed of a laminated film of a silicon layer 21-1 and silicide layer 21-2, for example. Cobalt silicide can be used to form the silicide layer 21, for example. Each control gate electrode 21 is also commonly used by other memory cells MC which are arranged side by side in the forward and backward directions (word line direction) of FIG. 2 and used as the word line WL.

The four memory cells MC are series-connected via diffusion layers 34 acting as the source and drain regions formed in the element region 13 to form a memory cell string CC.

Further, the drain-side selection transistor STD is arranged on one side of the memory cell string CC (on the right side of the four memory cells MC in the case of FIG. 2). A gate electrode GEd is formed above the element region 13 of the semiconductor substrate 11 with the gate insulating film 31 disposed therebetween in a position corresponding to the drain-side selection transistor STD. A bit line contact diffusion layer 35 is formed in a portion of the element region 13 which lies on the opposite side of the memory cells MC with respect to the drain-side selection transistor STD.

Further, the source-side selection transistor STS is arranged on the other side of the memory cell string CC (on the left side of the four memory cells MC in the case of FIG. 2). A gate electrode GEs is formed above the element region 13 of the semiconductor substrate 11 with the gate insulating film 31 disposed therebetween in a position corresponding to the source-side selection transistor STS. A source line contact diffusion layer 36 is formed in a portion of the element region 13 which lies on the opposite side of the memory cells MC with respect to the source-side selection transistor STS.

In this case, the gate electrode GEd of the drain-side selection transistor STD and the gate electrode GEs of the source-side selection transistor STS are respectively electrically connected a first control gate electrode 32' corresponding to the floating gate electrode 32 to a second control gate electrode 21' corresponding to the control gate electrode 21 by removing portions of the gate-gate insulating film 33. The second control gate electrode 21' is formed of a laminated film of the silicon layer 21-1 and silicide layer 21-2, for example.

That is, the memory cell MC is formed of the memory cell gate electrode GE and the diffusion layers 34 formed in the element region 13 on both sides of the gate electrode. Further, the drain-side selection transistor STD is configured by the gate electrode GEd of the drain-side selection transistor STD, the diffusion layer 34 formed in the element region 13 on the memory cell MC side and the bit line contact diffusion layer 35. Likewise, the source-side selection transistor STS is configured by the gate electrode GEs of the source-side selection transistor STS, the diffusion layer 34 formed in the element region 13 on the memory cell MC side and the source line contact diffusion layer 36.

Thus, the four memory cells MC are serially connected via the diffusion layers 34 without using contacts to configure the memory cell string CC. The drain-side selection transistor STD and source-side selection transistor STS are connected to the ends of the memory cell string CC via the respective diffusion layers 34 to configure the NAND cell unit CU.

Insulating films 37 formed of a silicon oxide film, for example, are formed between the memory cell gate electrodes GE and between the respective memory cell gate electrodes GE and the gate electrode GEd of the drain-side selection transistor STD, the gate electrode GEs of the source-side selection transistor STS. Further, insulating films (for example, silicon oxide films) 38 are respectively formed on side surfaces of the gate electrode GEd of the drain-side selection transistor STD and the gate electrode GEs of the source-side selection transistor STS which lie on the opposite sides of the respective memory cell gate electrodes GE. Insulating films 39 are formed on the surfaces of the respective insulating films 38. As the insulating film 39, a film having a different etching rate from that of the insulating film 38, for example, a silicon nitride film can be used. Insulating films 40 are formed on the surfaces of the respective insulating films 39. The insulating film 40 can be formed of a BPSG film (a silicon oxide film containing boron), for example.

An inter-level insulating film 41 is formed on the insulating films 37, 38, 39, 40 and gate electrodes GE, GEd, GEs. For example, the inter-level insulating film 41 is formed of a TEOS film (Tetra Ethoxy Silane film), for example.

The bit line contact electrode 24 and source line contact electrode 27 are formed through the inter-level insulating film 41, insulating films 39, 40 and gate insulating film 31. The bit line contact electrode 24 is connected to the bit line contact diffusion layer 35 and the source line contact electrode 27 is connected to the source line contact diffusion layer 36.

The bit line connecting portion 25 formed of a first interconnect layer is provided on the bit line contact electrode 24 and the bit line BL formed of a second interconnect layer is connected thereto via the interconnect-interconnect contact 26. A source lines SL formed of the first interconnect layer is provided on the source line contact 27. The source line SL, bit line connecting portion 25 and interconnect-interconnect contact 26 are covered with an interconnect-interconnect insulating film 42 and the bit line BL is formed thereon.

In the case of the present embodiment, the NAND cell unit CU has the four memory cells MC sandwiched between the selection transistors STD and STS. However, the number of memory cells is not limited to four and can be set to a desired number, for example, 16 or 32.

Further, when the well region is formed of a P-type region, the diffusion regions 34, 35, 36 are formed of N-type regions and when the well region is formed of an N-type region, the diffusion regions 34, 35, 36 are formed of P-type regions.

Figure 3:
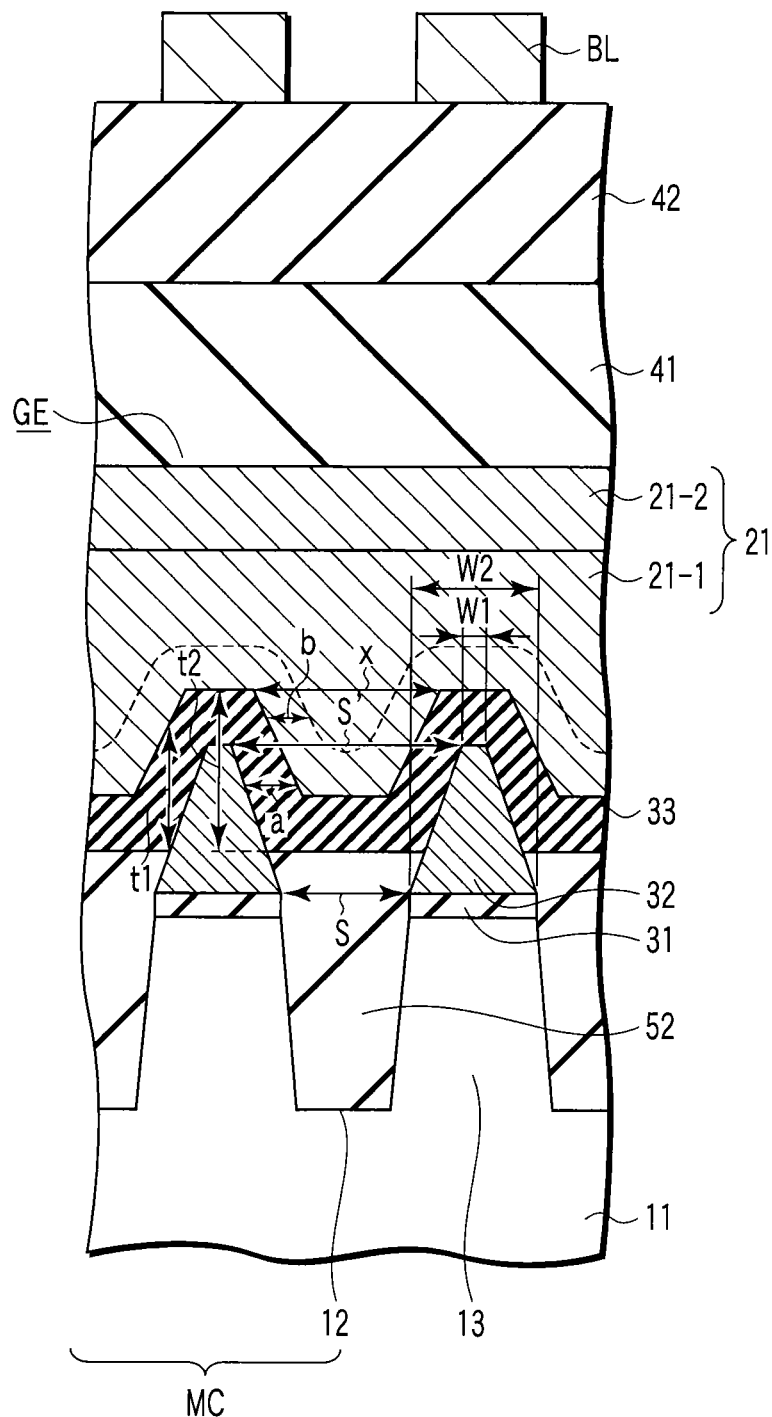
FIG. 3 is a cross-sectional view showing the nonvolatile semiconductor memory device taken along line III-III of FIG. 1.

FIG. 3 shows the cross section of the NAND nonvolatile semiconductor memory device taken along line III-III of FIG. 1. As shown in FIG. 3, a plurality of element isolation regions 12 are formed in the well region of the semiconductor substrate 11 and the element regions 13 are defined by the element isolation regions 12. The memory cell gate electrode GE of each memory cell MC is formed above the element regions 13 with gate insulating films 31 disposed therebetween.

That is, the floating gate electrodes 32 are formed on the respective gate insulating films 31 and the control gate electrode 21 is formed on the upper surfaces and side surfaces of the floating gate electrodes 32 with the gate-gate insulating film 33 disposed therebetween. The silicon layer 21-1 which is part of the control gate electrode 21 formed of the laminated film of the silicon layer 21-1 and silicide layer 21-2 is filled in between the floating gate electrodes 32 which are opposed in the word line direction.

The inter-level insulating film 41 is formed on the control gate electrode 21 and the interconnect-interconnect insulating film 42 is formed on the inter-level insulating film 41. The bit lines BL are formed on the interconnect-interconnect insulating film 42 to extend in a direction perpendicular to the word line direction.

In the case of the present embodiment, in order to attain the element isolation method, an STI (Shallow Trench Isolation) structure is used. However, as the element isolation method, another method such as a LOCOS (Local Oxidation of Silicon) method can be used.

In the NAND nonvolatile semiconductor memory device of the present embodiment, the width W1 of the upper portion of the floating gate electrode 32 in the channel width direction is set smaller than the width W2 of the lower portion thereof in the channel width direction. That is, for example, as shown in FIG. 3, the floating gate electrode 32 is formed in a trapezoidal form in the cross section taken along the channel width direction so that the width W1 of the upper portion thereof in the channel width direction is set smaller than the width W2 of the lower portion thereof in the channel width direction and the side surface thereof which makes contact with at least the gate-gate insulating film 33 is formed to have one flat surface. Thus, part of the control gate electrode 21 is fully filled in between the floating gate electrodes 32 which are opposed one another. Therefore, the coupling ratio of the memory cells MC can be prevented from being lowered and deterioration of the characteristics of the memory cell MC can be prevented with miniaturization thereof.

At this time, the width (maximum width x) of the control gate electrode 21 which is filled in between the opposed floating gate electrodes 32 is set larger than twice the distance (b) over which the control gate electrode 21 is depleted in the interface between the control gate electrode 21 and the gate-gate insulating film 33 (x>2b). When the control gate electrode 21 is formed of silicon, the distance (b) over which the control gate electrode 21 is depleted is different depending on the formation condition and operating condition and is normally set at approximately 3 nm at maximum. Therefore, as the floating gate electrode 32, for example, the minimum distance (S) between the opposed floating gate electrodes 32 is set smaller than the total sum of a value obtained by multiplying the film thickness (a) of the gate-gate insulating film 33 by 2 and the distance (b) over which the control gate electrode 21 is depleted (S<2(a+b)) and the maximum distance (S') between the opposed floating gate electrodes 32 is set larger than the total sum of a value obtained by multiplying the film thickness (a) of the gate-gate insulating film 33 by 2 and the distance (b) over which the control gate electrode 21 is depleted (S'>2(a+b)).

In this case, when the control gate electrode 21 is not formed of the laminated film of the silicon layer 21-1 and silicide layer 21-2 and is formed in a complete silicide form (completely silicified) or when the control gate electrode 21 is formed of metal, it is not necessary to set the width (x) of part of the control gate electrode 21 which is filled in between the opposed floating gate electrodes 32 larger than twice the distance (b) over which the control gate electrode 21 is depleted in the interface between the control gate electrode 21 and the gate-gate insulating film 33.

In the case of the present embodiment, the side surface of the floating gate electrode 32 is formed of one flat surface. Therefore, the floating gate electrode can be processed in one etching process and formed without increasing the number of steps.

Figure 4:
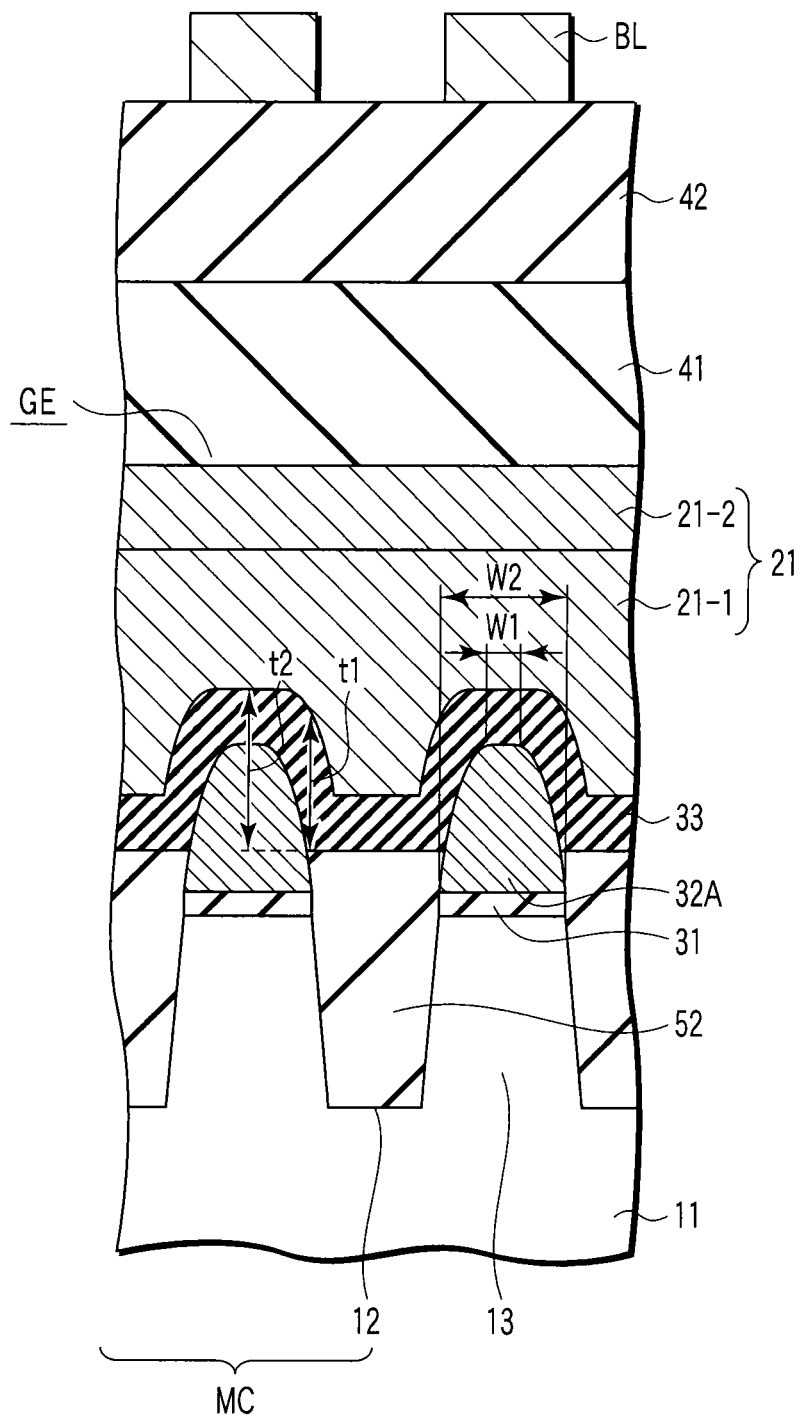
FIG. 4 is a cross-sectional view showing another example of the nonvolatile semiconductor memory device of FIG. 1.
Figure 5:
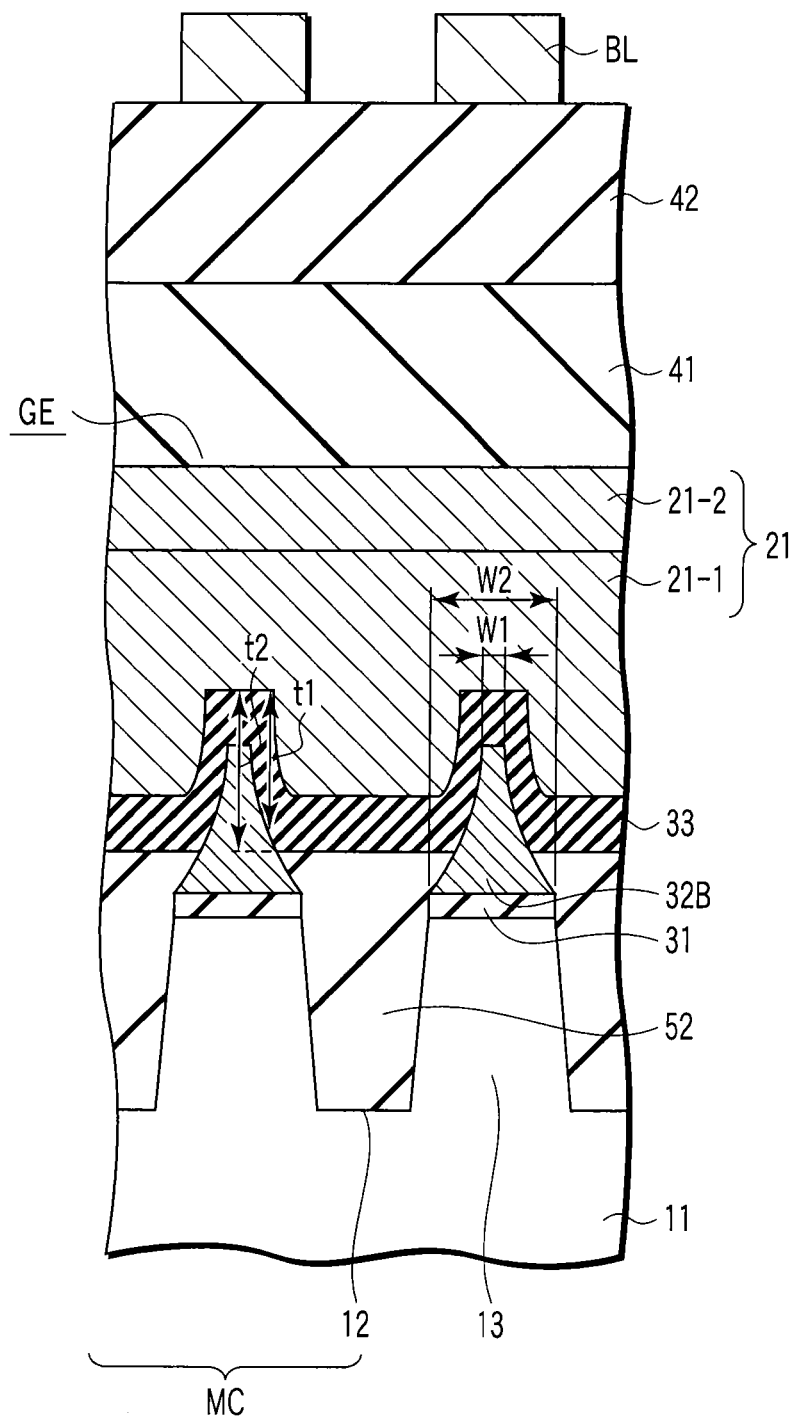
FIG. 5 is a cross-sectional view showing still another example of the nonvolatile semiconductor memory device of FIG. 1.

As the floating gate electrode, for example, the side surface thereof can be formed with a structure (32A) of a curved surface which is curved outwardly and projected upwardly as shown in FIG. 4. Alternatively, for example, the side surface thereof can be formed with a structure (32B) of a curved surface which is curved inwardly and projected downwardly as shown in FIG. 5. That is, if the side surface is formed without causing a step difference, it can be formed with high controllability without increasing the number of steps.

In particular, in the structure in which the width W1 of the upper portion of the floating gate electrode in the channel width direction is set smaller than the width W2 of the lower portion thereof in the channel width direction as in the floating gate electrodes 32, 32A, 32B, portions of the gate-gate insulating film 33 which are formed on the side surfaces of the floating gate electrodes 32, 32A, 32B can be completely eliminated at the processing time of the memory cell gate electrodes GE. That is, with the structure of the present embodiment, since the film thickness (maximum film thickness) t1 in the vertical direction of the gate-gate insulating film 33 on the side surface of each of the floating gate electrodes 32, 32A, 32B is made smaller than the distance t2 in the vertical direction from the lowest surface to the highest surface of the gate-gate insulating film 33, the above-described effect can be attained while the processing method of the gate-gate insulating film 33 can be simplified.

Next, the manufacturing method of the NAND nonvolatile semiconductor memory device with the above structure is simply explained with reference to FIGS. 6 to 10. FIGS. 6 to 10 show the cross sections corresponding to the cross section taken along line of FIG. 1. In this example, a case wherein the floating gate electrodes 32 with the structure shown in FIG. 3 are formed is explained as an example.

Figure 6:
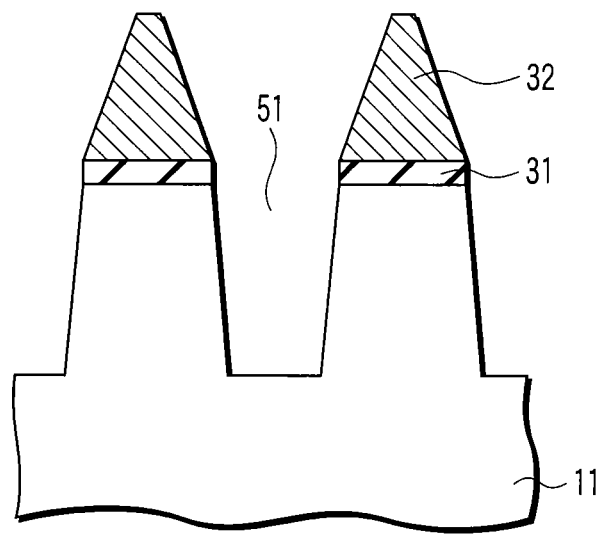
FIG. 6 is a cross-sectional view showing a step for illustrating a manufacturing method of the nonvolatile semiconductor memory device of FIG. 1.

First, for example, as shown in FIG. 6, a well region and channel regions (which are not shown in the drawing) are formed on the surface portion of a semiconductor substrate 11 and then a gate insulating film 31 is formed on the entire surface of the resultant structure. Next, polysilicon used to form a floating gate electrode 32 is deposited on the gate insulating film 31 and then the floating gate electrode 32, gate insulating film 31 and semiconductor substrate 11 are sequentially etched by a photolithography method to form groove portions 51 in the surface portion of the semiconductor substrate 11. At this time, in order to set the width W1 of the upper portion of the floating gate electrode 32 in the channel width direction smaller than the width W2 of the lower portion thereof in the channel width direction, for example, $HBr/O_2$ series gas is used, the pressure is set at 50 mTorr or more and the bias is set at 100 W or less as the etching condition.

Figure 7:
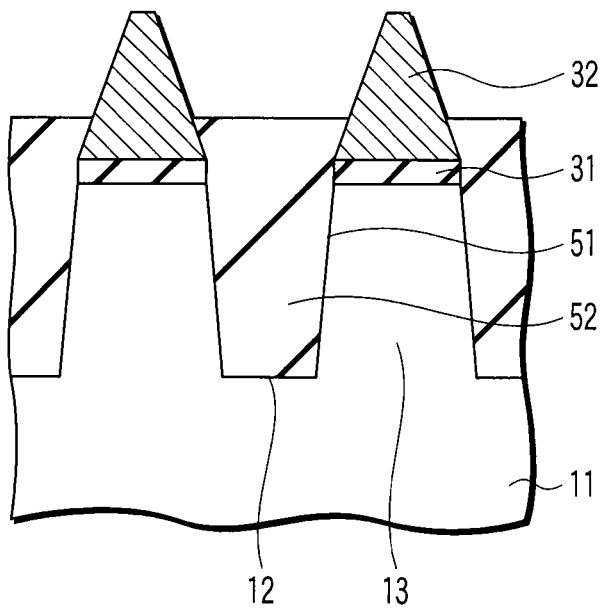
FIG. 7 is a cross-sectional view showing a step for illustrating the manufacturing method of the nonvolatile semiconductor memory device of FIG. 1.

Next, for example, as shown in FIG. 7, an element isolation insulating film 52 formed of a silicon oxide film is filled in the groove portions 51 and then the element isolation insulating film 52 is etched back to adequate height to form element isolation regions 12. Thus, element regions 13 are defined by the element isolation regions 12.

Figure 8:
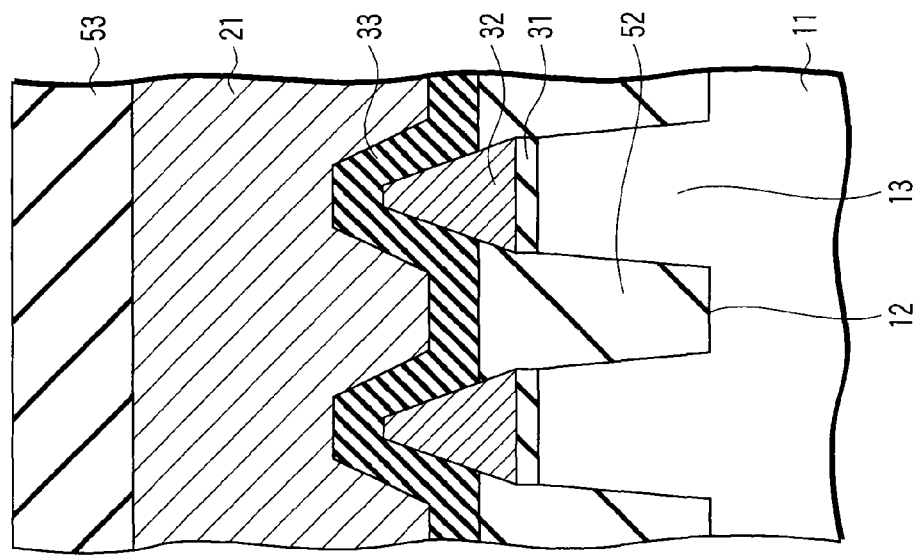
FIG. 8 is a cross-sectional view showing a step for illustrating the manufacturing method of the nonvolatile semiconductor memory device of FIG. 1.

After this, for example, as shown in FIG. 8, a gate-gate insulating film (for example, a laminated film of a silicon oxide film/silicon nitride film/silicon oxide film) 33, a control gate electrode 21 formed of polysilicon and a gate mask member 53 formed of a silicon nitride film are sequentially formed on the floating gate electrodes 32 and element isolation regions 12. At this time, in portions (regions) in which the gate electrodes GEd, GEs of selection transistors STD, STS are formed, portions of the gate-gate insulating film 33 are eliminated to electrically connect first control gate electrodes 32' corresponding to the floating gate electrode 32 to second control gate electrodes 21' corresponding to the control gate electrode 21, respectively.

Next, the gate mask member 53 is patterned by the photolithography method and then the control gate electrodes 21, 21', gate-gate insulating film 33 and floating gate electrodes 32, 32' are etched in a self-alignment manner with respect to the gate mask member 53. Thus, the memory cell gate electrodes GE, the gate electrodes GEd of the drain-side selection transistors STD and the gate electrodes GEs of the source-side selection transistors STS are simultaneously formed. Further, a post-oxidation process is performed to restore damages caused at the gate processing time and then impurities are ion-implanted to form diffusion layers 34, 35, 36.

Figure 9:
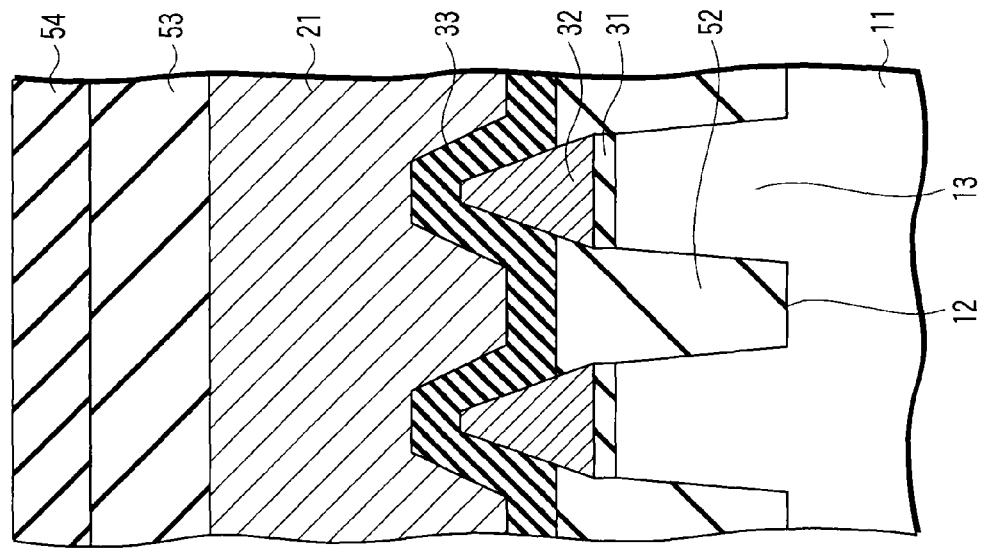
FIG. 9 is a cross-sectional view showing a step for illustrating the manufacturing method of the nonvolatile semiconductor memory device of FIG. 1.

Next, for example, as shown in FIG. 9, a silicon oxide film 54 used to form insulating films 37, 38 is formed. The silicon oxide film 54 is formed with the film thickness to completely fill spaces between the memory cell gate electrodes GE, between the memory cell gate electrodes GE and the gate electrodes GEd of the drain-side selection transistors STD and between the memory cell gate electrodes GE and the gate electrodes GEs of the source-side selection transistors STS. However, the silicon oxide film 54 is formed with the film thickness so as not to completely fill spaces between the gate electrodes GEd of the drain-side selection transistors STD and between the gate electrodes GEs of the source-side selection transistors STS.

After this, the silicon oxide film 54 is etched back to respectively form insulating films 37 between the memory cell gate electrodes GE of the memory cells MC, between the memory cell gate electrodes GE and the gate electrodes GEd of the drain-side selection transistors STD and between the memory cell gate electrodes GE and the gate electrodes GEs of the source-side selection transistors STS. Further, insulating films 38 are formed to leave the silicon oxide films 54 as side walls between the gate electrodes GEd of the drain-side selection transistors STD and between the gate electrodes GEs of the source-side selection transistors STS.

Figure 10:
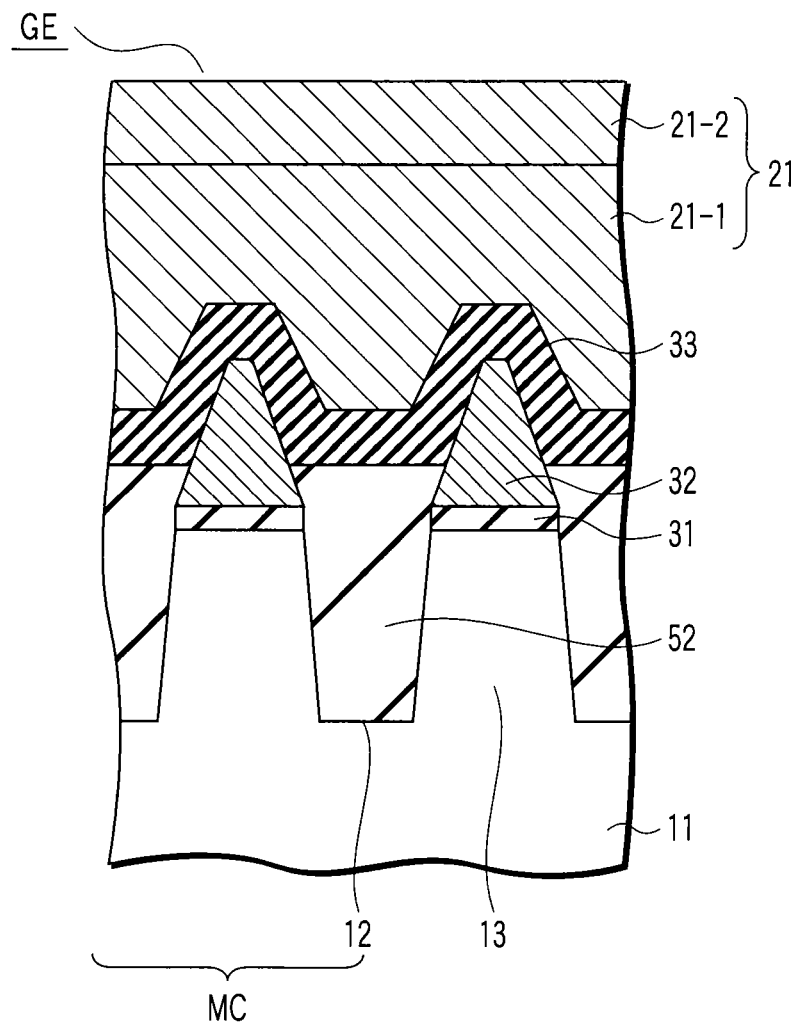
FIG. 10 is a cross-sectional view showing a step for illustrating the manufacturing method of the nonvolatile semiconductor memory device of FIG. 1.

Then, an insulating film 39 formed of a silicon nitride film and an insulating film 40 formed of a BPSG film are sequentially deposited to fill spaces between the gate electrodes GEd of the drain-side selection transistors STD and between the gate electrodes GEs of the source-side selection transistors STS. After this, for example, as shown in FIG. 10, cobalt is deposited on the upper surfaces of the control gate electrodes 21 and the heat treatment is performed to react polysilicon with cobalt and form silicide layers 21-2 on the silicon layers 21-1. As a result, the control gate electrode 21 is formed with the laminated structure of the silicon layer 21-1 and silicide layer 21-2. Thus, the memory cell gate electrodes GE of the memory cells MC, the gate electrodes GEd of the drain-side selection transistors STD and the gate electrodes GEs of the source-side selection transistors STS are completed.

Next, an inter-level insulating film 41 is deposited, contact holes which permit contacts with the bit line contact diffusion layers 35 and source line contact diffusion layers 36 are formed and then metal such as aluminum or tungsten or a semiconductor material of low resistance is filled into the contact holes to form bit line contact electrodes 24 and source line contact electrodes 27.

After this, bit line connecting portions 25 and source lines SL are formed by forming a metal interconnect layer (first interconnect layer) on the inter-level insulating film 41. Further, an interconnect-interconnect insulating film 42 is deposited, contact holes which permit contacts with the bit line connecting portions 25 are formed and then metal such as aluminum or tungsten or a semiconductor material of low resistance is filled into the contact holes to form interconnect-interconnect contacts 26. Next, the NAND nonvolatile semiconductor memory device having the floating gate electrodes 32 with the cross section as shown in FIG. 3, for example, is completed by forming bit lines BL connected to the interconnect-interconnect contacts 26 on the interconnect-interconnect insulating film 42.

As described above, in the NAND nonvolatile semiconductor memory device having the memory cell gate electrodes with the structure formed by laminating the floating gate electrodes and control gate electrodes with the gate-gate insulating films disposed therebetween, the floating gate electrode is formed with such a structure that the width of the upper portion thereof in the channel width direction is set smaller than the width of the lower portion thereof in the channel width direction and the side surface thereof which makes contact with at least the gate-gate insulating film has one flat surface, a curved surface which is outwardly curved or a curved surface which is inwardly curved. Thus, even in a case of the memory cell in which the minimum distance between the opposed floating gate electrodes is smaller than twice the film thickness of the gate-gate insulating film, part of the control gate electrode can be fully filled in between the floating gate electrodes. As a result, the coupling ratio of the memory cells can be prevented from being lowered and the characteristics of the memory cell can be enhanced.

In particular, the gate-gate insulating film can be easily etched without increasing the number of steps at the processing time of the floating gate electrodes by making the film thickness (maximum film thickness) of the gate-gate insulating film in the vertical direction smaller than the distance from the lowest surface to the highest surface thereof in the vertical direction.

Further, part of the control gate electrode can be more stably filled into a portion in which the distance between the opposed floating gate electrodes becomes minimum by setting the minimum distance between the opposed floating gate electrodes smaller than the total sum of a value obtained by multiplying the film thickness of the gate-gate insulating film by 2 and the distance over which the control gate electrode is depleted.

In the present embodiment, a case wherein the floating gate electrodes 32 with the structure shown in FIG. 3 are formed is explained as an example, but this invention is not limited to this case. For example, this applies to a case wherein the floating gate electrodes 32A with the structure shown in FIG. 4 are formed and a case wherein the floating gate electrodes 32B with the structure shown in FIG. 5 are formed.

[Second Embodiment]

Figure 11:
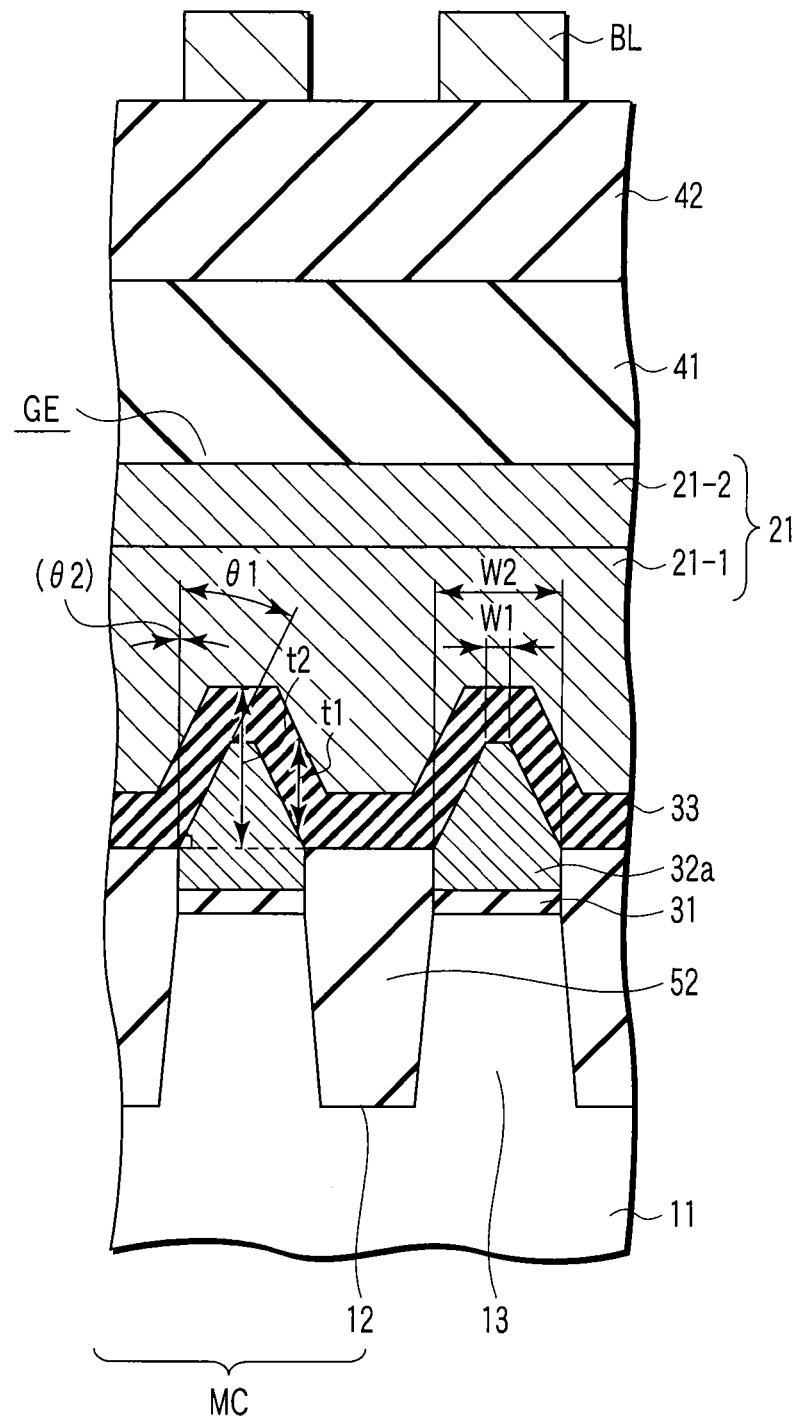
FIG. 11 is a cross-sectional view showing an example of the structure of a nonvolatile semiconductor memory device according to a second embodiment of this invention.

FIG. 11 shows the basic structure of a nonvolatile semiconductor memory device according to a second embodiment of this invention. In FIG. 11, the structure of a portion corresponding to the cross section of the NAND nonvolatile semiconductor memory device (refer to FIG. 1) according to the first embodiment taken along line III-III is shown. In FIG. 11, portions which are the same as those of the NAND nonvolatile semiconductor memory device according to the first embodiment are denoted by the same reference symbols and the detail explanation thereof is omitted.

As shown in FIG. 11, in the case of the present embodiment, in floating gate electrodes 32a with the structure which is so formed that the width W1 of the upper portion thereof in the channel width direction is set smaller than the width W2 of the lower portion thereof in the channel width direction and the side surface thereof which makes contact with at least the gate-gate insulating film 33 has one flat surface, an angle θ1 between a portion of the side surface which makes contact with the gate-gate insulating film 33 and the vertical direction is set larger than an angle θ2 between a portion of the element isolation region 12 which makes contact with the element isolation insulating film 52 (a portion which does not make contact with the second insulating film) and the vertical direction (in this example, θ2 is substantially 0°). That is, the side surface of the floating gate electrode 32a has a portion (first flat surface) formed in contact with the gate-gate insulating film 33 and a portion (second flat surface) formed in contact with the element isolation insulating film 52 of the element isolation region 12.

When the floating gate electrode is formed with the above structure, part of the control gate electrode 21 can be fully filled into between the opposed floating gate electrodes 32a. As a result, the coupling ratio of the memory cells MC can be prevented from being lowered and the characteristics of the memory cell MC can be prevented from deteriorating.

With the structure of the present embodiment, it is necessary to set the width of a portion of the control gate electrode 21 which is filled in between the opposed floating gate electrodes 32a larger than twice the distance over which the control gate electrode 21 is depleted in the interface between the control gate electrode 21 and the gate-gate insulating film 33. However, when the control gate electrode 21 is not formed with the laminated structure of the silicon layer 21-1 and silicide layer 21-2 and is formed in a complete silicide form or formed of metal, it is not necessary to set the width of a portion of the control gate electrode 21 which is filled in between the opposed floating gate electrodes 32a larger than twice the distance over which the control gate electrode 21 is depleted in the interface between the control gate electrode 21 and the gate-gate insulating film 33.

Further, the first flat surface of the side surface of the floating gate electrode 32a which makes contact with at least the gate-gate insulating film 33 is formed of one surface. Therefore, a portion of the floating gate electrode 32a which makes contact with the gate-gate insulating film 33 can be processed by one etching step and can be formed without increasing the number of steps.

The portions of the side surfaces of the floating gate electrode 32a which make contact with the gate-gate insulating film 33 and element isolation regions 12 may be configured to have curved surfaces which are curved outwardly and projected upwardly or curved inwardly and projected downwardly. That is, if the portion is formed with a plurality of surfaces having different tilt angles without having a step difference, it can be formed with high controllability without increasing the number of steps.

With the above structure, it is necessary to completely remove the gate-gate insulating film 33 formed on the side surfaces of the floating gate electrodes 32a at the processing time of the memory cell gate electrodes GE. Therefore, from the viewpoint that the method of processing the gate-gate insulating film 33 is simplified, as in the case of the first embodiment, it is desirable to set the film thickness (maximum film thickness) t1 in the vertical direction of the gate-gate insulating film 33 formed on the side surfaces of the floating gate electrode 32a smaller than the distance t2 from the lowest surface to the highest surface of the gate-gate insulating film 33 in the vertical direction.

Figure 12:
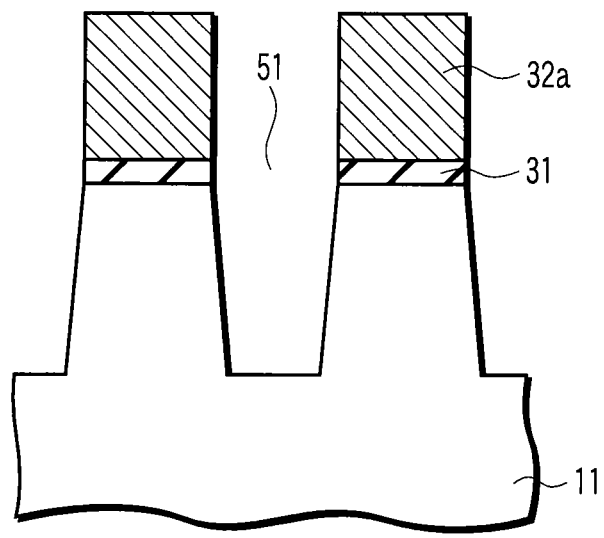
FIG. 12 is a cross-sectional view showing a step for illustrating a manufacturing method of the nonvolatile semiconductor memory device of FIG. 11.
Figure 13:
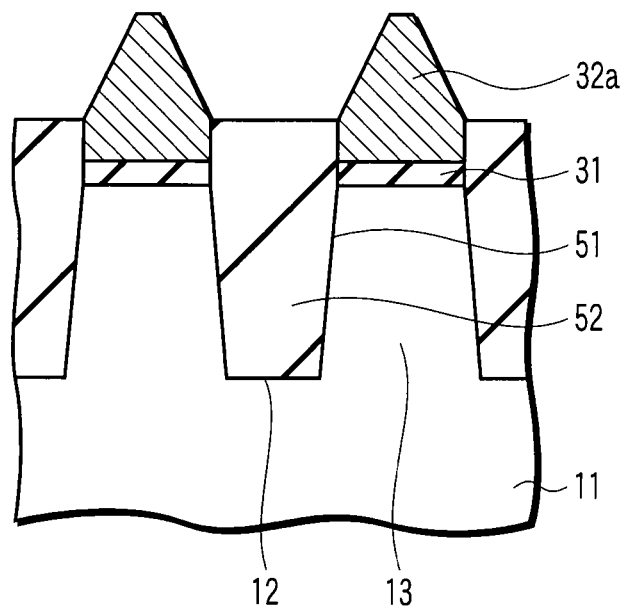
FIG. 13 is a cross-sectional view showing a step for illustrating the manufacturing method of the nonvolatile semiconductor memory device of FIG. 11.
Figure 14:
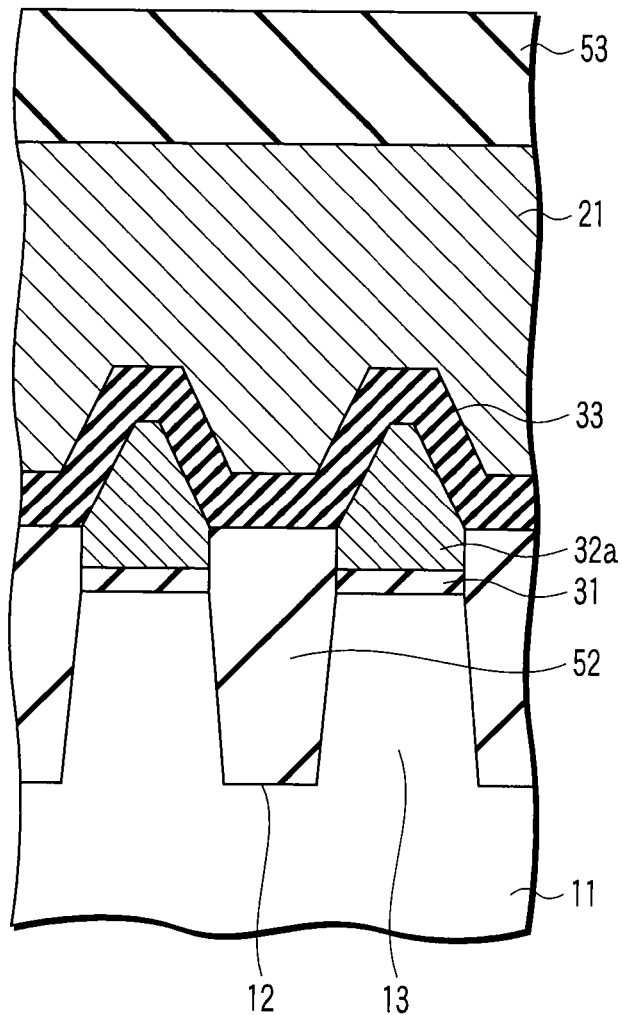
FIG. 14 is a cross-sectional view showing a step for illustrating the manufacturing method of the nonvolatile semiconductor memory device of FIG. 11.

Next, a manufacturing method of the NAND nonvolatile semiconductor memory device with the above structure is simply explained with reference to FIGS. 12 to 14. FIGS. 12 to 14 each show a portion corresponding to the cross section taken along line III-III of FIG. 1.

First, for example, as shown in FIG. 12, a well region and channel regions (which are not shown in the drawing) are formed on the surface portion of a semiconductor substrate 11 and then a gate insulating film 31 is formed on the entire surface of the resultant structure. Next, polysilicon used to form a floating gate electrode 32a is deposited on the gate insulating film 31 and then the floating gate electrode 32a, gate insulating film 31 and semiconductor substrate 11 are sequentially etched by a photolithography method to form groove portions 51 in the surface portion of the semiconductor substrate 11.

Next, for example, as shown in FIG. 13, an element isolation insulating film 52 formed of a silicon oxide film is filled in the groove portions 51 and then the element isolation insulating film 52 is etched back to adequate height to form element isolation regions 12. Thus, element regions 13 are defined by the element isolation regions 12. At this time, an angle θ1 between a portion of the side surface of the floating gate electrode 32a which makes contact with the gate-gate insulating film 33 and the vertical direction is set larger than an angle θ2 between a portion thereof which makes contact with the element isolation region 12 and the vertical direction by etching back the element isolation insulating film 52 by use of gas having the CF4:CHF3 ratio set at 5:1, for example.

Then, for example, as shown in FIG. 14, a gate-gate insulating film (for example, a laminated film of a silicon oxide film/silicon nitride film/silicon oxide film) 33, a control gate electrode 21 formed of polysilicon and a gate mask member 53 formed of a silicon nitride film are sequentially formed on the floating gate electrodes 32a and element isolation regions 12.

After this, the NAND nonvolatile semiconductor memory device having the floating gate electrodes 32a with the cross section shown in FIG. 11 is completed by performing the same process as that explained in the first embodiment (for example, refer to FIGS. 9 and 10).

Next, modifications (other examples of the structure) of the second embodiment are simply explained.

Figure 15:
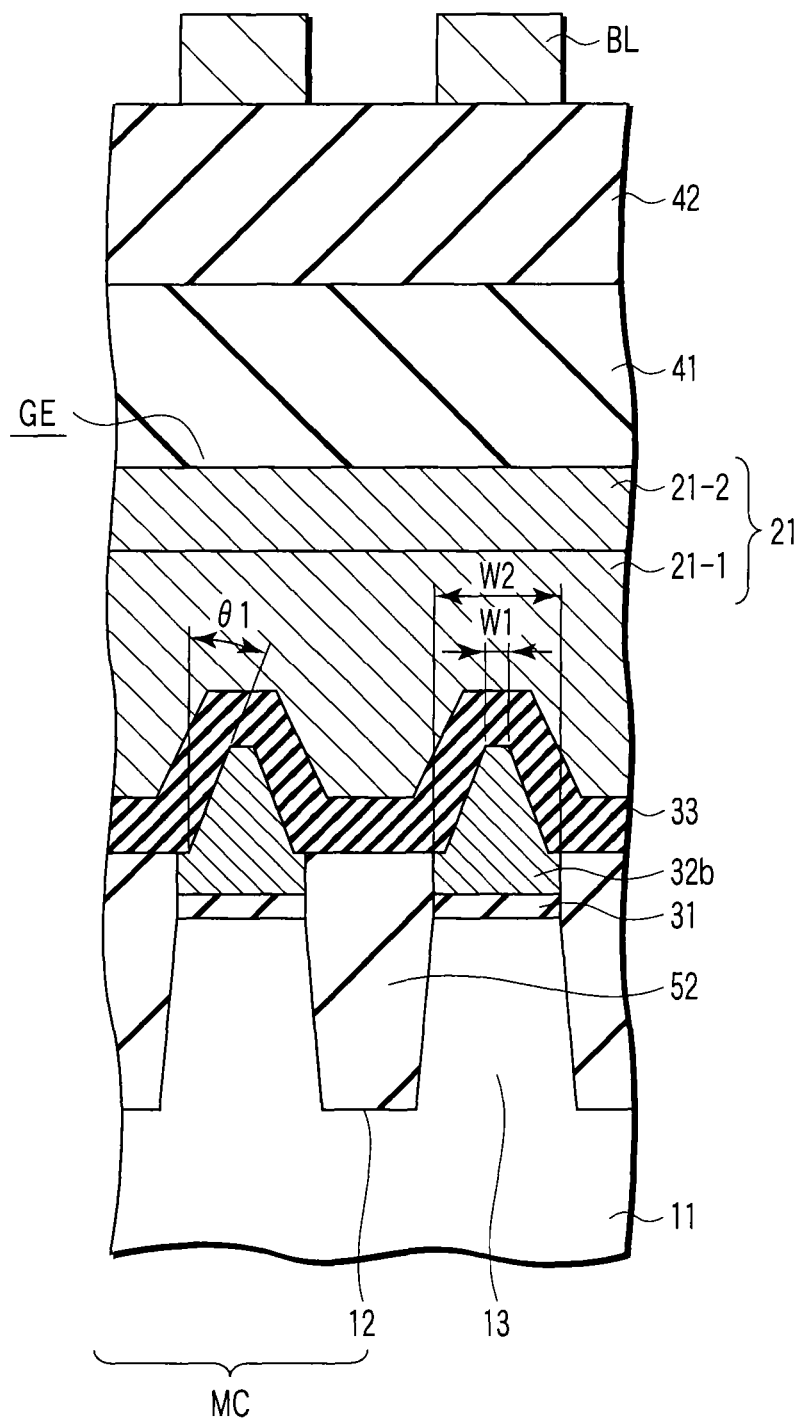
FIG. 15 is a cross-sectional view showing a first modification of the nonvolatile semiconductor memory device shown in FIG. 11.

FIG. 15 shows a first modification of the NAND nonvolatile semiconductor memory device according to the second embodiment. In the case of the first modification, each floating gate electrode 32b is different from the floating gate electrode 32a with the structure shown in FIG. 11 in that a step difference is formed between a portion (first flat surface) of the side surface of the floating gate electrode 32b which makes contact with the gate-gate insulating film 33 and a portion (second flat surface) thereof which makes contact with the element isolation region 12.

That is, the floating gate electrode 32b is so formed that the width W1 of the upper portion thereof in the channel width direction is set smaller than the width W2 of the lower portion thereof in the channel width direction, the side surface thereof which makes contact with at least the gate-gate insulating film 33 forms one flat surface and a step difference is formed between a portion thereof which makes contact with the gate-gate insulating film 33 and is formed to set the angle made with the vertical direction to θ1 (θ1>θ2) and a portion thereof which makes contact with the element isolation region 12 and is formed to set the angle made with the vertical direction to θ2 (θ2=0).

The above structure can be formed by the following method. First, for example, as shown in FIG. 13, an element isolation insulating film 52 filled in the groove portions 51 is etched back to form element isolation regions 12 and define element regions 13. At this time, an angle θ1 made between a portion of the side surface of the floating gate electrode 32b which makes contact with the gate-gate insulating film 33 and the vertical direction is set larger than an angle (θ2) made between a portion thereof which makes contact with the element isolation region 12 and the vertical direction. Next, a step difference is formed between the portion of the side surface of the floating gate electrode 32b which makes contact with the gate-gate insulating film 33 and the portion thereof which makes contact with the element isolation region 12 by performing the wet etching process by use of, for example, hot phosphoric acid to maintain the angle θ1 made between the portion which makes contact with the gate-gate insulating film 33 and the vertical direction. After this, the NAND nonvolatile semiconductor memory device having the floating gate electrodes 32b with the cross section shown in FIG. 15 is completed by performing the same process as that explained in the first embodiment (refer to FIGS. 8 to 10).

Figure 16:
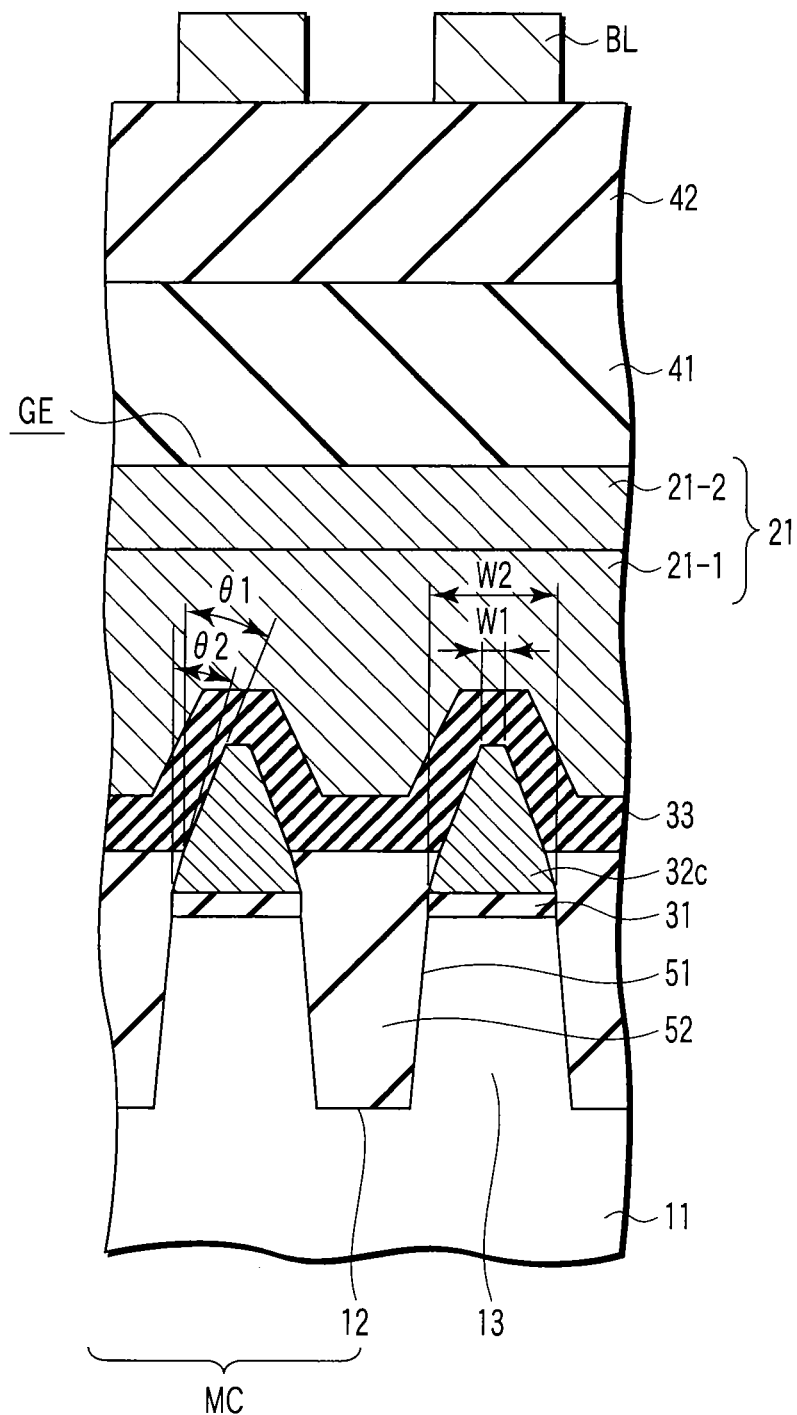
FIG. 16 is a cross-sectional view showing a second modification of the nonvolatile semiconductor memory device shown in FIG. 11.

FIG. 16 shows a second modification (another example of the structure) of the NAND nonvolatile semiconductor memory device according to the second embodiment. In the case of the second modification, each floating gate electrode 32c is different from the floating gate electrode 32a with the structure shown in FIG. 11 in that an angle θ2 between a portion of the side surface of the floating gate electrode 32c which makes contact with the element isolation region 12 (a second flat surface which does not make contact with the second insulating film) and the vertical direction is set larger than 0° (in this case, θ2<θ1).

That is, the floating gate electrode 32c is so formed that the width W1 of the upper portion thereof in the channel width direction is set smaller than the width W2 of the lower portion thereof in the channel width direction, the side surface which makes contact with at least the gate-gate insulating film 33 forms one flat surface (first flat surface) and the side surface thereof is formed of a portion which makes contact with the gate-gate insulating film 33 and is formed to set the angle made with the vertical direction to θ1 and a portion which makes contact with the element isolation region 12 and is formed to set the angle made with the vertical direction to θ2 ((θ1>θ2>0).

The above structure can be formed by the following method. First, for example, as shown in FIG. 6, when the floating gate electrodes 32c are processed by the etching process, the processing operation is controlled to set the width W1 of the upper portion of the floating gate electrode 32c in the channel width direction smaller than the width W2 of the lower portion thereof in the channel width direction and then an element isolation insulating film 52 formed of a silicon oxide film is filled into groove portions 51. Next, for example, as shown in FIG. 16, in the step of etching back the element isolation insulating film 52 to adequate height, an angle θ1 between a portion of the side surface of the floating gate electrode 32c which makes contact with the gate-gate insulating film 33 and the vertical direction is controlled and set to be larger than an angle θ2 between a portion thereof which makes contact with the element isolation region 12 and the vertical direction. After this, the NAND nonvolatile semiconductor memory device having the floating gate electrodes 32c with the cross section shown in FIG. 16 is completed by performing the same process as that explained in the first embodiment (for example, refer to FIGS. 8 to 10).

Figure 17:
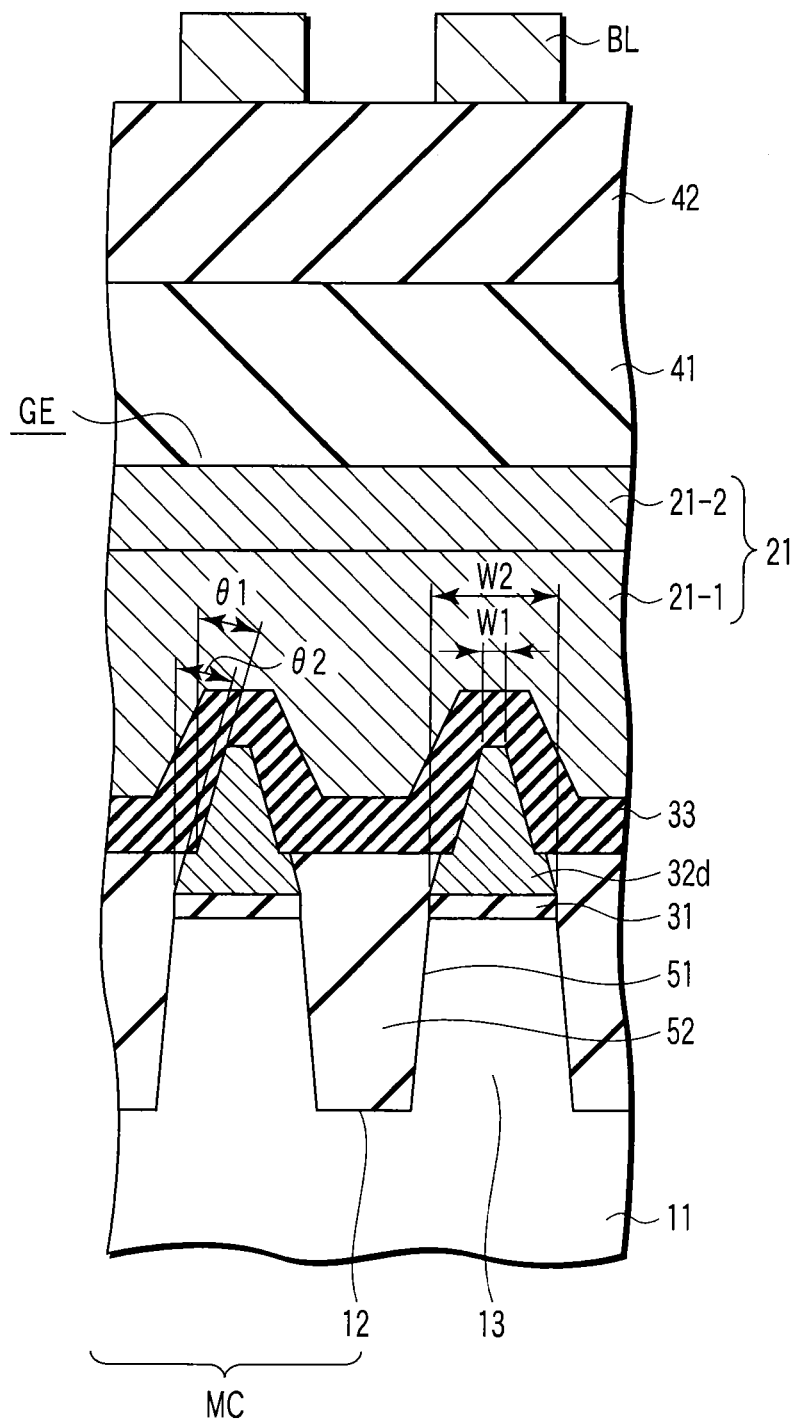
FIG. 17 is a cross-sectional view showing a third modification of the nonvolatile semiconductor memory device shown in FIG. 11.

FIG. 17 shows a third modification (another example of the structure) of the NAND nonvolatile semiconductor memory device according to the second embodiment. In the case of the third modification, each floating gate electrode 32d is different from the floating gate electrode 32a with the structure shown in FIG. 11 in that an angle θ2 between a portion (a second flat surface) of the side surface of the floating gate electrode 32d which makes contact with the element isolation region 12 and the vertical direction is set larger than 0° and a step difference is formed between a portion (first flat surface) thereof which makes contact with the gate-gate insulating film 33 and a portion thereof which makes contact with the element isolation region 12.

That is, the floating gate electrode 32d is so formed that the width W1 of the upper portion thereof in the channel width direction is set smaller than the width W2 of the lower portion thereof in the channel width direction, the side surface which makes contact with at least the gate-gate insulating film 33 forms one flat surface and a step difference is formed between the portion which makes contact with the gate-gate insulating film 33 and is formed to set the angle made with the vertical direction to θ1 (θ1>θ2) and the portion which makes contact with the element isolation region 12 and is formed to set the angle made with the vertical direction to θ2 ((θ1>θ2>0).

The above structure can be formed by the following method. First, for example, as shown in FIG. 6, when the floating gate electrodes 32d are processed by the etching process, the processing operation is controlled to set the width W1 of the upper portion of the floating gate electrode 32d in the channel width direction smaller than the width W2 of the lower portion thereof in the channel width direction and then an element isolation insulating film 52 formed of a silicon oxide film is filled into the groove portions 51. Next, for example, as shown in FIG. 17, in the step of etching back the element isolation insulating film 52 to adequate height, a step difference is formed between the portion of the side surface of the floating gate electrode 32d which makes contact with the gate-gate insulating film 33 and the portion thereof which makes contact with the element isolation region 12 and an angle θ1 between the portion which makes contact with the gate-gate insulating film 33 and the vertical direction is controlled and set to be larger than an angle e2 between the portion which makes contact with the element isolation region 12 and the vertical direction. After this, the NAND nonvolatile semiconductor memory device having the floating gate electrodes 32d with the cross section shown in FIG. 17 is completed by performing the same process as that explained in the first embodiment (for example, refer to FIGS. 8 to 10).

As described above, in the floating gate electrodes 32b, 32c, 32d with the structures shown in FIGS. 15 to 17, the same effect as that obtained in the floating gate electrode 32a with the structure shown in 11 can be attained. That is, in the floating gate electrode with the structure in which the width of the upper portion in the channel width direction is set smaller than the width of the lower portion in the channel width direction and the side surface thereof which makes contact with at least the gate-gate insulating film is formed of one flat surface, a portion of the control gate electrode can be sufficiently filled in between the opposed floating gate electrodes when an angle between the portion which makes contact with the gate-gate insulating film and the vertical direction is set larger than an angle (0°) between the portion which makes contact with the element isolation region and the vertical direction or when a step difference is formed between the portion which makes contact with the gate-gate insulating film and the portion which makes contact with the element isolation region. As a result, a lowering in the coupling ratio of the memory cells can be suppressed and the characteristics of the memory cells can be enhanced without increasing the number of steps of forming the floating gate electrodes.

[Third Embodiment]

Figure 18:
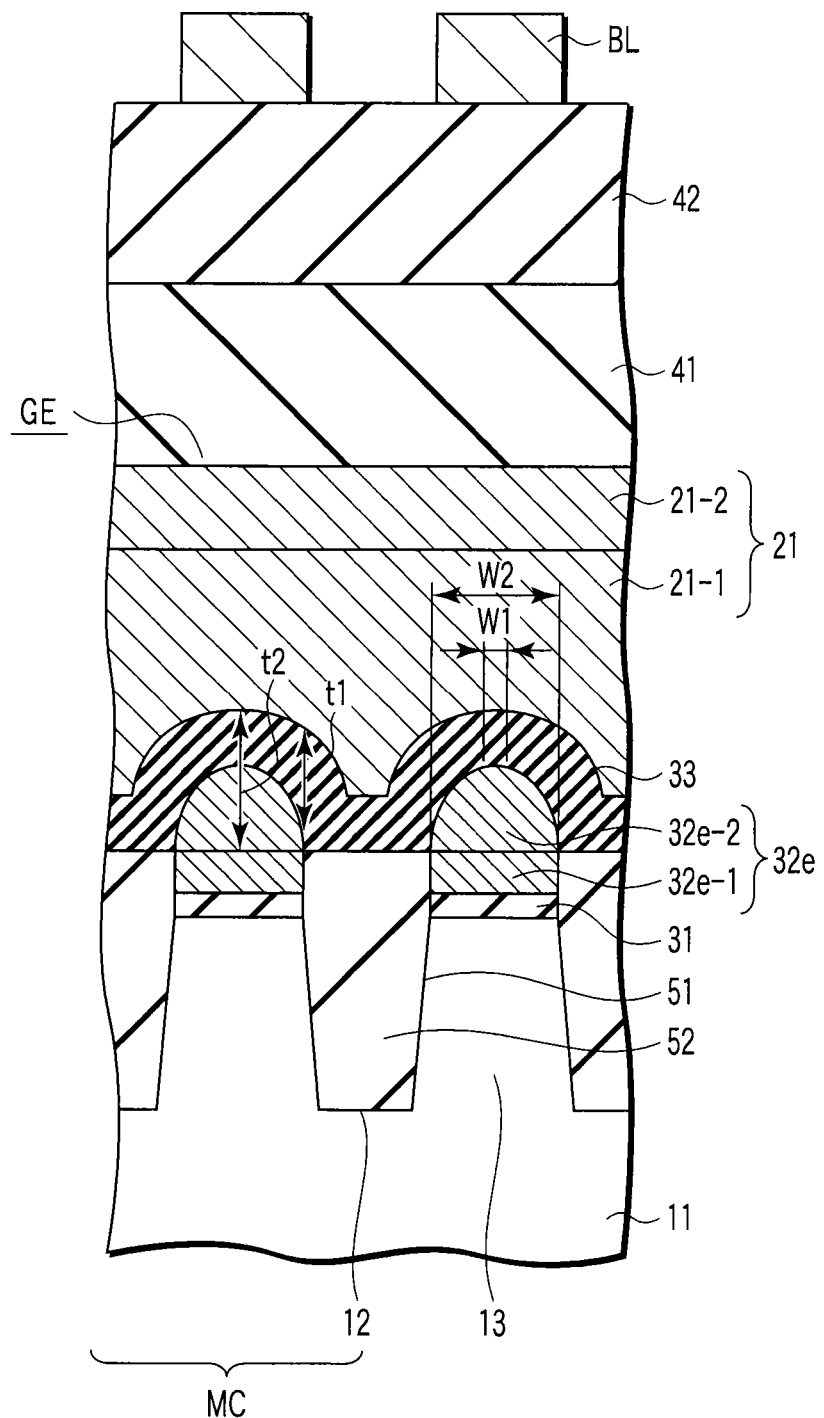
FIG. 18 is a cross-sectional view showing an example of the structure of a nonvolatile semiconductor memory device according to a third embodiment of this invention.

FIG. 18 shows the basic structure of a nonvolatile semiconductor memory device according to a third embodiment of this invention. In FIG. 18, the structure of a portion corresponding to the cross section of the NAND nonvolatile semiconductor memory device (refer to FIG. 1) according to the first embodiment taken along line III-III is shown. Portions which are the same as those of the NAND nonvolatile semiconductor memory device according to the first embodiment are denoted by the same reference symbols and the detail explanation thereof is omitted.

As shown in FIG. 18, in the case of the present embodiment, each floating gate electrode 32e is formed with such a structure that the width W1 of the upper portion thereof in the channel width direction is set smaller than the width W2 of the lower portion thereof in the channel width direction and the side surface thereof which makes contact with at least a gate-gate insulating film 33 has one curved surface. That is, each floating gate electrode 32e has a portion 32e-1 which makes contact with a corresponding one of element isolation insulating films 52 of element isolation regions 12 and a portion (the upper portion of the floating gate electrode 32e) 32e-2 which makes contact with the gate-gate insulating film 33 and the portion 32e-2 which makes contact with the gate-gate insulating film 33 is formed to have an outwardly curved surface in an upwardly convex form.

When the floating gate electrodes are formed with the above structure, portions of control gate electrodes 21 can be sufficiently filled into between the opposed floating gate electrodes 32e. As a result, the coupling ratio of the memory cells MC can be prevented from being lowered and the characteristics of the memory cell MC can be prevented from deteriorating.

With the structure of the present embodiment, it is necessary to set the width of the control gate electrode 21 filled in between the opposed floating gate electrodes 32e larger than twice the distance over which the control gate electrode 21 is depleted in the interface between the control gate electrode 21 and the gate-gate insulating film 33. However, when the control gate electrode 21 is not formed with the laminated film of the silicon layer 21-1 and silicide layer 21-2 and is formed in a complete silicide form or formed of metal, it is not necessary to set the width of a portion of the control gate electrode 21 which is filled in between the opposed floating gate electrodes 32e larger than twice the distance over which the control gate electrode 21 is depleted in the interface between the control gate electrode 21 and the gate-gate insulating film 33.

With the above structure, it is necessary to completely remove portions of the gate-gate insulating film 33 which are formed on the side surfaces of the floating gate electrodes 32e at the processing time of the memory cell gate electrodes GE. Therefore, as in the case of the first embodiment, in order to simplify the method of processing the gate-gate insulating film 33, it is desirable to set the film thickness (maximum film thickness) t1 in the vertical direction of the gate-gate insulating film 33 formed on the side surfaces of the floating gate electrodes 32e smaller than the distance t2 from the lowest surface to the highest surface of the gate-gate insulating film 33 in the vertical direction.

Next, a manufacturing method of the NAND nonvolatile semiconductor memory device with the above structure is simply explained with reference to FIGS. 19 to 22. FIGS. 19 to 22 each show a portion corresponding to the cross section taken along line III-III of FIG. 1.

Figure 19:
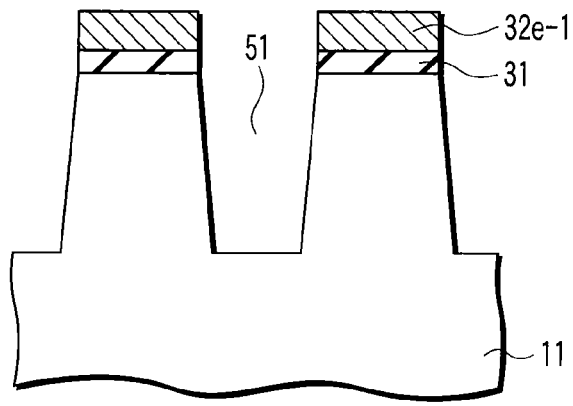
FIG. 19 is a cross-sectional view showing a step for illustrating a manufacturing method of the nonvolatile semiconductor memory device of FIG. 18.

First, for example, as shown in FIG. 19, a well region and channel regions (which are not shown in the drawing) are formed in the surface portion of a semiconductor substrate 11 and then a gate insulating film 31 is formed on the entire surface of the resultant structure. Next, polysilicon used to form a floating gate electrode 32e is deposited on the gate insulating film 31 and then a lower-side floating gate electrode 32e-1, gate insulating film 31 and semiconductor substrate 11 are sequentially etched by a photolithography method to form groove portions 51 in the surface portion of the semiconductor substrate 11.

Figure 20:
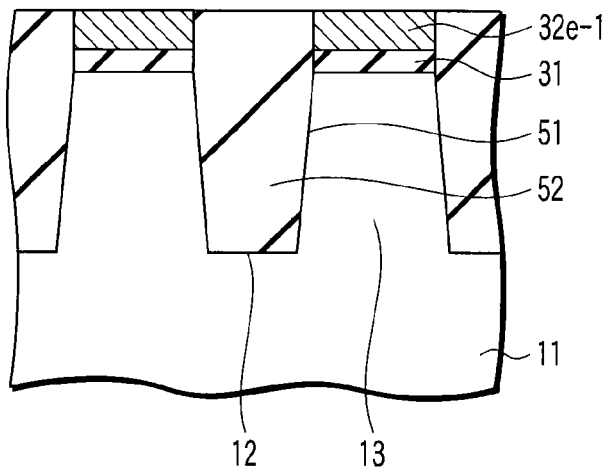
FIG. 20 is a cross-sectional view showing a step for illustrating the manufacturing method of the nonvolatile semiconductor memory device of FIG. 18.

Next, for example, as shown in FIG. 20, an element isolation insulating film 52 formed of a silicon oxide film is filled in the grooves 51 and then the element isolation insulating film 52 is etched back to the height of the upper surfaces of the floating gate electrodes 32e-1 to form element isolation regions 12. Thus, element regions 13 are defined by the element isolation regions 12. At this time, the surface of the resultant structure may be made flat by means of the chemical mechanical polishing (CMP) method.

Figure 21:
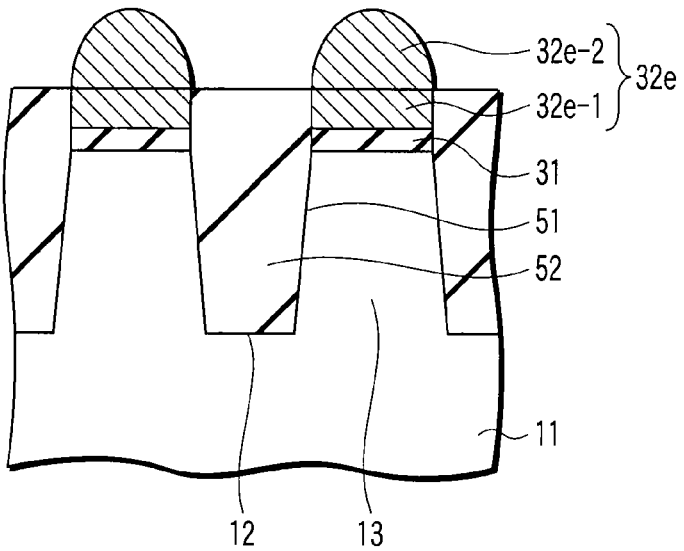
FIG. 21 is a cross-sectional view showing a step for illustrating the manufacturing method of the nonvolatile semiconductor memory device of FIG. 18.

Next, for example, as shown in FIG. 21, silicon is grown on the floating gate electrodes 32e-1 to form upper-side floating gate electrodes 32e-2 having curved surfaces in an upwardly convex form. As a result, each floating gate electrode 32e has the laminated structure of the lower-side floating gate electrode 32e-1 and upper-side floating gate electrode 32e-2.

Next, for example, as shown in FIG. 22, a gate-gate insulating film (for example, a laminated film of a silicon oxide film/silicon nitride film/silicon oxide film) 33, a control gate electrode 21 formed of polysilicon and a gate mask member 53 formed of a silicon nitride film are sequentially formed on the floating gate electrodes 32e and element isolation regions 12.

After this, the NAND nonvolatile semiconductor memory device having the floating gate electrodes 32e with the cross section shown in FIG. 18 is completed by performing the same process as that explained in the first embodiment (for example, refer to FIGS. 9 and 10).

As described above, in the NAND nonvolatile semiconductor memory device including memory cell gate electrodes with the structures each formed by laminating the control gate electrode above the floating gate electrode with the gate-gate insulating film disposed therebetween, part of the control gate electrode can be fully filled in between the opposed floating gate electrodes even in memory cells in which the minimum distance between the opposed floating gate electrodes is smaller than twice the film thickness of the gate-gate insulating film by forming the floating gate electrode with such a structure that the width of the upper portion of the floating gate electrode in the channel width direction is set smaller than the width of the lower portion thereof in the channel width direction, the side surface thereof which makes contact with at least the gate-gate insulating film has one curved surface and the side surface thereof which does not make contact with the gate-gate insulating film has one flat surface. As a result, the coupling ratio of the memory cells can be prevented from being lowered and the characteristics of the memory cell can be enhanced.

In particular, the gate-gate insulating film can be easily etched by making the film thickness (maximum film thickness) in the vertical direction of the gate-gate insulating film formed on the side surface of the floating gate electrode smaller than the distance from the lowest surface to the highest surface of the gate-gate insulating film in the vertical direction.

In the above embodiments, a case wherein the NAND nonvolatile semiconductor memory device is taken as an example is explained, but this invention is not limited to this case. For example, this invention can be applied to any nonvolatile semiconductor memory device such as a NOR or AND nonvolatile semiconductor memory device having floating gate electrodes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a semiconductor substrate;
    a plurality of element regions defined by element isolation regions formed of element isolation insulating film;
    a plurality of floating gate electrodes respectively formed above the element regions of the semiconductor substrate with first insulating films disposed therebetween; and
    a control gate electrode formed above the plurality of floating gate electrodes with a second insulating film disposed therebetween, a portion of the control gate electrode being filled in between opposed ones of the plurality of floating gate electrodes,
    wherein each of the plurality of floating gate electrodes is formed to have a width of an upper portion thereof in a channel width direction which is smaller than width of a lower portion thereof in the channel width direction and one of contact surfaces thereof on at least opposed sides which contact the second insulating film is formed to have one flat surface,
    sides of the plurality of floating gate electrodes each have a first contact surface which contacts the second insulating film above a top surface of the element isolation insulating film and a second contact surface which contacts the element isolation insulating film, and
    a first angle between the first contact surface and the vertical direction is larger than a second angle between the second contact surface and the vertical direction and the second angle is 0°.

2. The nonvolatile semiconductor memory device according to claim 1, wherein the plurality of floating gate electrodes each have a step difference between the first contact surface and the second contact surface.

3. The nonvolatile semiconductor memory device according to claim 1, wherein a minimal interval between opposed ones of the plurality of floating gate electrodes is smaller than a sum of a value that is twice as large as the thickness of the second insulating film and a distance over which the control gate electrode is depleted.

4. The nonvolatile semiconductor memory device according to claim 1, wherein the second insulating film has a maximum film thickness in a vertical direction, the maximum film thickness being set smaller than a distance from a lowest surface to a highest surface of the second insulating film in the vertical direction.

5. The nonvolatile semiconductor memory device according to claim 1, wherein the first contact surface includes a first surface which an end of the first surface contacts to the element isolation insulating film and a second surface which contacts to another end of the first surface, and
    the plurality of floating gate electrodes have a step difference between the second contact surface and the second surface, and height of the end of the first surface is equal to height of an end of the second contact surface in the vertical direction.

6. The nonvolatile semiconductor memory device according to claim 1, wherein the first contact surface includes a first surface having one end of which contacts the element isolation insulating film, and a second surface which contacts the other end of the first surface, and
    the sides of the plurality of floating gate electrodes have a step difference between the second surface and the second contact surface, and the other end of the first surface and an end of the second contact surface are equal in height.

7. A nonvolatile semiconductor memory device comprising:
    a semiconductor substrate;
    a plurality of element regions defined by element isolation regions formed of element isolation insulating film;
    a plurality of floating gate electrodes respectively formed above the element regions of the semiconductor substrate with first insulating films disposed therebetween; and
    a control gate electrode formed above the plurality of floating gate electrodes with a second insulating film disposed therebetween, a portion of the control gate electrode being filled in between opposed ones of the plurality of floating gate electrodes,
    wherein each of the plurality of floating gate electrodes is formed to have a width of an upper portion thereof in a channel width direction which is smaller than width of a lower portion thereof in the channel width direction and one of contact surfaces thereof on at least opposed sides which contact the second insulating film is formed to have one flat surface,
    sides of the plurality of floating gate electrodes each have a first contact surface which contacts the second insulating film above a top surface of the element isolation insulating film and a second contact surface which contacts the element isolation insulating film, and
    a first angle between the first contact surface and the vertical direction is larger than a second angle between the second contact surface and the vertical direction,
    wherein the first contact surface includes a first surface having one end of which contacts the element isolation insulating film, and a second surface which contacts the other end of the first surface, and
    the sides of the plurality of floating gate electrodes have a step difference between the second surface and the second contact surface, and the other end of the first surface and an end of the second contact surface are equal in height.

8. The nonvolatile semiconductor memory device according to claim 7, wherein the plurality of floating gate electrodes each have a step difference between the first contact surface and the second contact surface.

9. The nonvolatile semiconductor memory device according to claim 7, wherein a minimal interval between opposed ones of the plurality of floating gate electrodes is smaller than a sum of a value that is twice as large as the thickness of the second insulating film and a distance over which the control gate electrode is depleted.

10. The nonvolatile semiconductor memory device according to claim 7, wherein the second insulating film has a maximum film thickness in a vertical direction, the maximum film thickness being set smaller than a distance from a lowest surface to a highest surface of the second insulating film in the vertical direction.

11. The nonvolatile semiconductor memory device according to claim 7, wherein the first contact surface includes a first surface which an end of the first surface contacts to the element isolation insulating film and a second surface which contacts to another end of the first surface, and the plurality of floating gate electrodes have a step difference between the second contact surface and the second surface, and height of the end of the first surface is equal to height of an end of the second contact surface in the vertical direction.

* * * * *